United States Patent
Hisamoto et al.

(10) Patent No.: US 11,302,828 B2
(45) Date of Patent: Apr. 12, 2022

(54) SEMICONDUCTOR DEVICE

(71) Applicant: RENESAS ELECTRONICS CORPORATION, Tokyo (JP)

(72) Inventors: Digh Hisamoto, Tokyo (JP); Yoshiyuki Kawashima, Tokyo (JP); Takashi Hashimoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/084,163

(22) Filed: Oct. 29, 2020

(65) Prior Publication Data

US 2021/0151609 A1 May 20, 2021

(30) Foreign Application Priority Data

Nov. 15, 2019 (JP) .............................. JP2019-207061

(51) Int. Cl.
*H01L 29/792* (2006.01)
*H01L 27/11568* (2017.01)
*H01L 29/78* (2006.01)
*H01L 27/092* (2006.01)

(52) U.S. Cl.
CPC ........ *H01L 29/792* (2013.01); *H01L 27/0924* (2013.01); *H01L 27/11568* (2013.01); *H01L 29/7851* (2013.01); *H01L 29/7855* (2013.01)

(58) Field of Classification Search
CPC .............. H01L 29/792; H01L 27/0924; H01L 27/11568; H01L 29/7851; H01L 29/7855; H01L 29/42344; H01L 29/40117; H01L 27/11565; H01L 29/66833; H01L 29/66795
See application file for complete search history.

(56) References Cited

U.S. PATENT DOCUMENTS

| 7,504,689 | B2 | 3/2009 | Hisamoto et al. |
| 10,043,814 | B2 | 8/2018 | Yamashita |
| 2015/0145023 | A1* | 5/2015 | Arigane ............ H01L 27/11568 257/326 |
| 2016/0141396 | A1* | 5/2016 | Arigane ................ H01L 29/517 438/591 |
| 2016/0233221 | A1* | 8/2016 | Chang ............... H01L 29/40114 |
| 2017/0200726 | A1* | 7/2017 | Tsuda ................ H01L 29/42344 |

(Continued)

FOREIGN PATENT DOCUMENTS

| EP | 3 144 960 A2 | 3/2017 |
| JP | 2006-041354 A | 2/2006 |
| JP | 2017-045860 A | 3/2017 |

OTHER PUBLICATIONS

Extended European Search Report issued in corresponding European Patent Application No. 20207359.9-1212, dated Mar. 31, 2021.

*Primary Examiner* — Earl N Taylor
(74) *Attorney, Agent, or Firm* — McDermott Will & Emery LLP

(57) ABSTRACT

A semiconductor device includes a memory cell which is configured of a FinFET having a split-gate type MONOS structure, the FinFET has a plurality of source regions formed in a plurality of fins, and the plurality of source regions are commonly connected by a source line contact. Further, the FinFET has a plurality of drain regions formed in the plurality of fins, the plurality of drain regions are commonly connected by a bit line contact, and the FinFET constitutes a memory cell of 1 bit.

9 Claims, 38 Drawing Sheets

(56) References Cited

U.S. PATENT DOCUMENTS

| | | | |
|---|---|---|---|
| 2018/0097007 A1* | 4/2018 | Tsukuda | H01L 27/1157 |
| 2018/0182774 A1* | 6/2018 | Narumi | H01L 29/66833 |
| 2019/0280096 A1* | 9/2019 | Amo | H01L 29/40117 |
| 2019/0312043 A1* | 10/2019 | Mihara | H01L 29/7851 |
| 2021/0143260 A1* | 5/2021 | Hisamoto | H01L 29/66833 |
| 2021/0151609 A1* | 5/2021 | Hisamoto | H01L 29/7855 |

\* cited by examiner

|  | VBL | VWL | VMG | VSL | VB |
|---|---|---|---|---|---|
| Erase | GND | Vcge | Vmge | Vse | GND |
| Program | GND/Vcc | Vcgp | Vmgp | Vsp | GND |
| Read | Vcc | Vcc | GND | GND | GND |

B:

|  | VBL | VWL | VMG | VSL | VB |
|---|---|---|---|---|---|
| Erase | 0 | 0 | -5 | 5 | 0 |
| Program | 0/1.5 | 0.5 | 10 | 5 | 0 |
| Read | 1.5 | 1.5 | 0 | 0 | 0 |

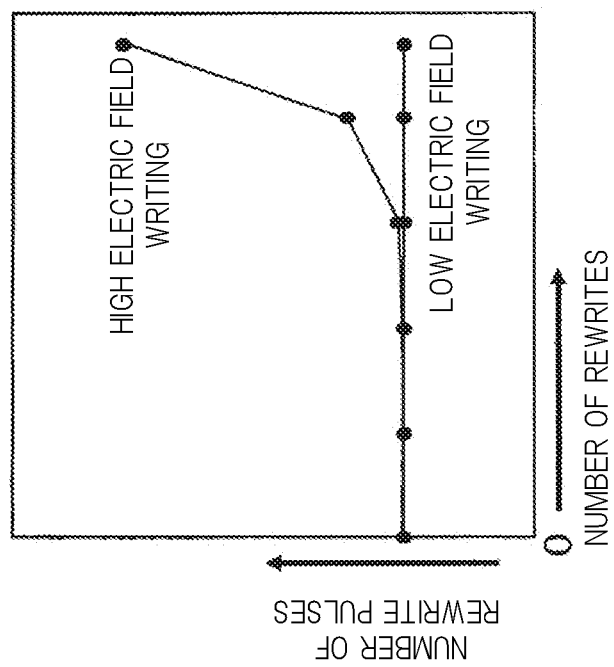

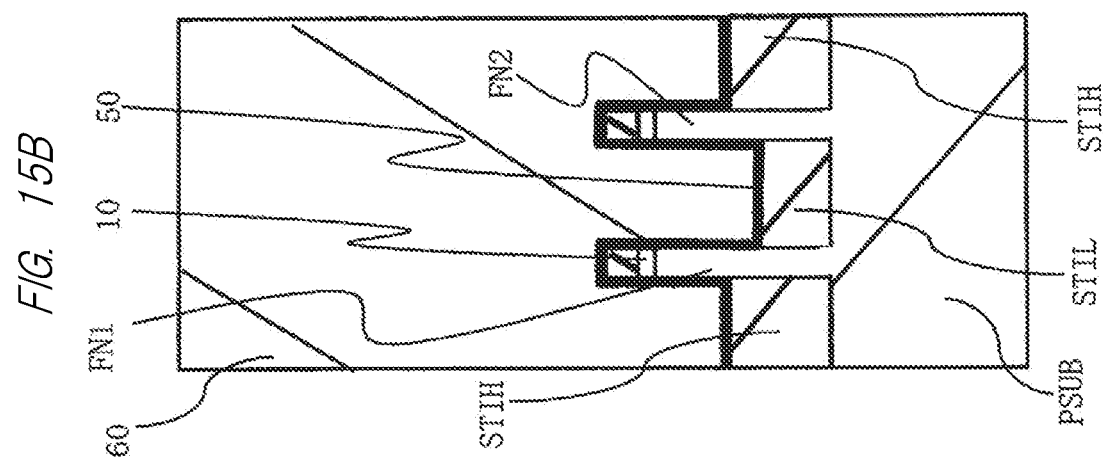

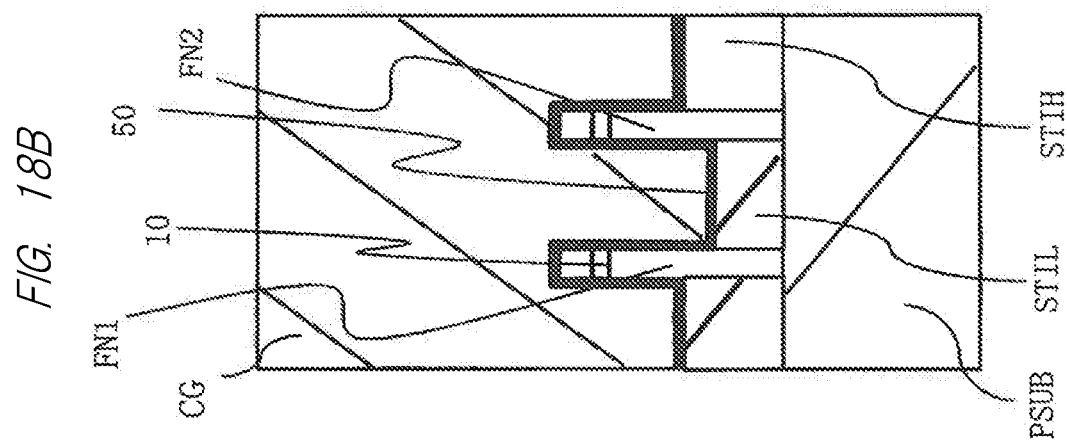

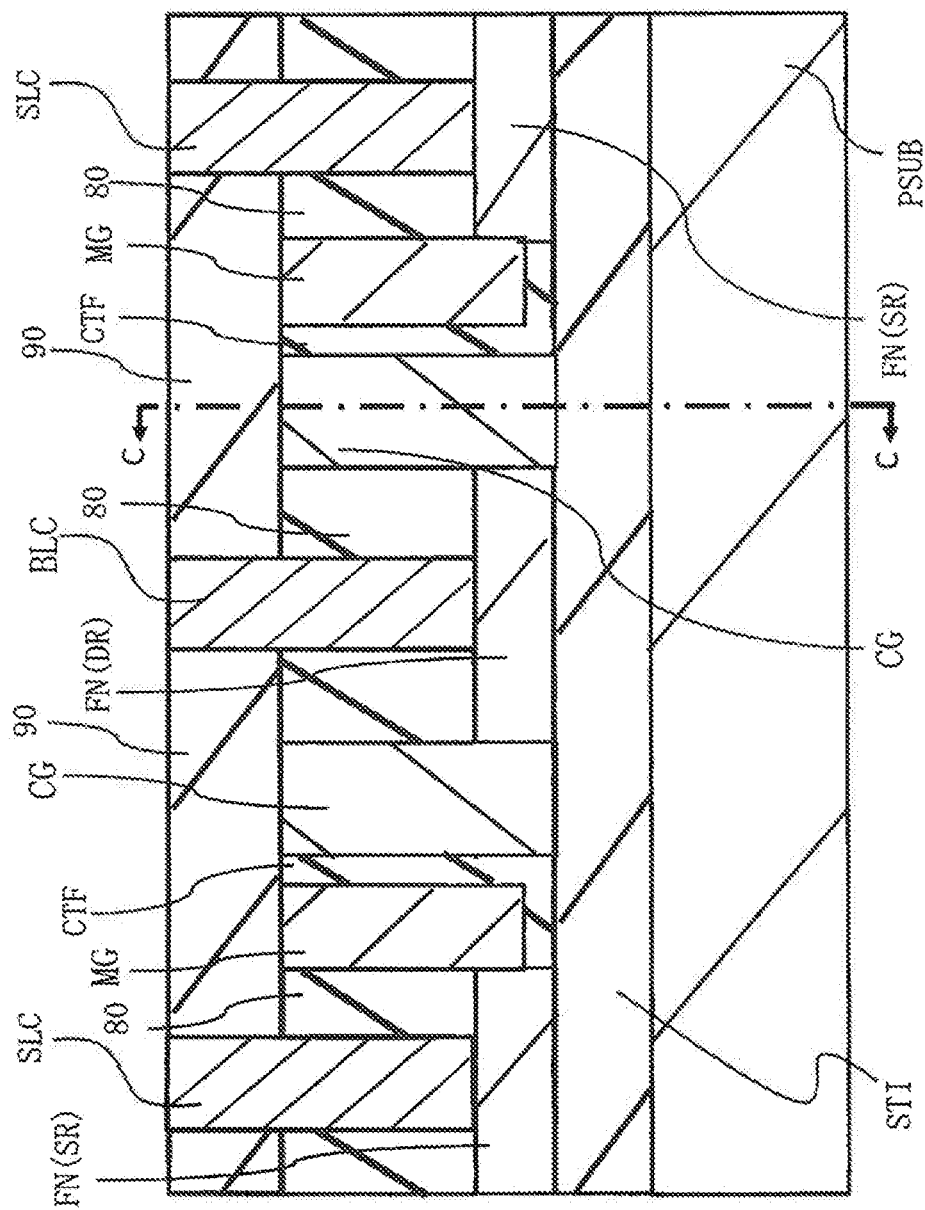

SEMICONDUCTOR DEVICE

CROSS-REFERENCE TO RELATED APPLICATION

The disclosure of Japanese Patent Application No. 2019-207061 filed on Nov. 15, 2019 including the specification, drawings and abstract is incorporated herein by reference in its entirety.

TECHNICAL FIELD OF THE INVENTION

The present invention relates to a semiconductor device, and particularly relates to a technology suitably applied to a semiconductor device including a transistor with fin structure.

BACKGROUND OF THE INVENTION

A flash memory or an EEPROM (Electrically Erasable and Programmable Read Only Memory) has been widely used as a non-volatile memory mounted in an MCU (Micro Computer Unit). These storage devices have a conductive floating gate electrode surrounded by an oxide film or a trapping dielectric film under the gate electrode of the MISFET (Metal Insulator Semiconductor Field Effect Transistor), and are configured to use the charge accumulation state in the floating gate or the trapping dielectric film as storage information and readout it as the threshold of the transistor. The trapping dielectric film mentioned here is a dielectric film capable of accumulating charges, and examples thereof include a silicon nitride film. The MISFET can be used as a non-volatile memory by shifting the threshold of the MISFET by the injection and emission of the charges into and from the charge accumulation film like this. This flash memory is referred to also as MONOS (Metal Oxide Nitride Oxide Semiconductor) transistor. Also, the split-gate type memory cell using the MONOS transistor as a memory transistor and further added with a control transistor has been widely used.

In addition, a transistor with fin structure has been known as a field effect transistor capable of achieving the increase in operation speed, the reduction in leakage current and power consumption, and the miniaturization of semiconductor elements. The transistor with fin structure (FinFET; Fin Field Effect Transistor) is, for example, a semiconductor element configured to have a semiconductor layer protruding on a semiconductor substrate as a channel region and a gate electrode formed so as to straddle the protruding semiconductor layer.

There are disclosed techniques listed below.
[Patent Document 1] Japanese Unexamined Patent Application Publication No. 2006-41354
[Patent Document 2] Japanese Unexamined Patent Application Publication No. 2017-45860

Patent Document 1 discloses a split-gate type memory cell having a MONOS transistor.

Patent Document 2 discloses a technology for forming a MONOS transistor as a transistor with fin structure.

SUMMARY OF THE INVENTION

A split-gate type memory cell having a MONOS transistor that uses hot carriers for writing and erasing of information is configured to change the threshold of a memory transistor by trapping electrons having negative charge or holes having positive charge in a charge storage layer (referred to also as charge accumulation layer) formed under a memory gate electrode, thereby performing the reading of the storage information as the change in the read current value.

Since the split-gate type memory cell uses the split-gate structure in which a transistor having a control gate and a transistor having a memory gate are connected in series, it is referred to as a split-gate type charge trapping memory cell.

When an n-type MOSFET is used for a transistor having a control gate, in order to increase the read current, it is effective to increase the amount of stored holes by the injection of holes into the charge storage layer and reduce the threshold of a transistor having a memory gate. On the contrary, in order to bring the transistor into a high-threshold state, the injection of a large amount of electrons capable of compensating a large amount of holes stored in the charge storage layer is required. Therefore, in order to obtain a constant read current while advancing the miniaturization of the memory cell, it is required to increase the amount of injected charge per unit channel.

However, the application of high electric field is needed in order to increase the amount of injected charge at the time of the writing and the erasing of memory cell, but this leads to the deterioration in the rewrite endurance and the charge storage characteristics of the transistor, which poses a great concern in the operation of the memory cell. For example, according to the studies by the inventors of the present invention, as shown in FIG. 4A and FIG. 4B, when the electric field at the rewriting is high (high electric field writing), the greater deterioration in rewrite endurance and charge storage characteristics is observed as compared with the case where the electric field is low (low electric field writing). Note that, in FIG. 4A, the number of rewrites and the number of rewrite pulses represent that the numbers increase relatively in the direction indicated by the arrows. Also, in FIG. 4B, the charge storage time represents that the time increases relatively in the direction indicated by the arrow and the amount of threshold change represents that the threshold changes (deteriorates) relatively in the direction indicated by the arrow.

When a FinFET is used as a transistor of a memory cell for the purpose of the miniaturization of the memory cell, since the transistor is configured to have a three-dimensional structure, the field concentration is likely to occur at the tip or the corner of the fin which is a semiconductor layer protruding on the semiconductor substrate and the extremely high electric field is locally applied, so that it is expected that the deterioration in rewrite endurance and the charge storage characteristics becomes more serious concern.

The other object and novel feature will be apparent from the description of this specification and attached drawings.

The summary of the typical embodiment disclosed in this application will be simply described as follows.

A semiconductor device according to one embodiment includes a memory cell configured of a FinFET having a split-gate type MONOS structure, and a memory cell of 1 bit is formed of a FinFET using a plurality of fins. Further, a trench formed between a plurality of fins used for a FinFET constituting a memory cell of the same bit is formed to be deeper than a trench formed between fins used for a FinFET of another different bit.

By the semiconductor device according to one embodiment, it is possible to improve the information rewrite characteristics of the memory cell configured of the FinFET having a split-gate type MONOS structure.

BRIEF DESCRIPTIONS OF THE DRAWINGS

FIG. 3 is a bias condition diagram showing an example of the conditions of the bias applied during an operation of a split-gate type MONOS using a FinFET according to one embodiment;

FIG. 4A is a diagram showing a correlation of the number of rewrites and the number of rewrite pulses in a high electric field and a low electric field sturdied by the inventors of the present invention;

FIG. 15B is a cross-sectional view showing a principal part corresponding to the one-dot chain line C-C in FIG. 15A;

FIG. 18B is a cross-sectional view showing a principal part corresponding to the one-dot chain line C-C in FIG. 18A;

FIG. 22A is a cross-sectional view showing a principal part in the manufacturing process of the memory cell using the FinFET having the split-gate type MONOS following FIG. 21A;

DESCRIPTIONS OF THE PREFERRED EMBODIMENTS

Figure 1A:
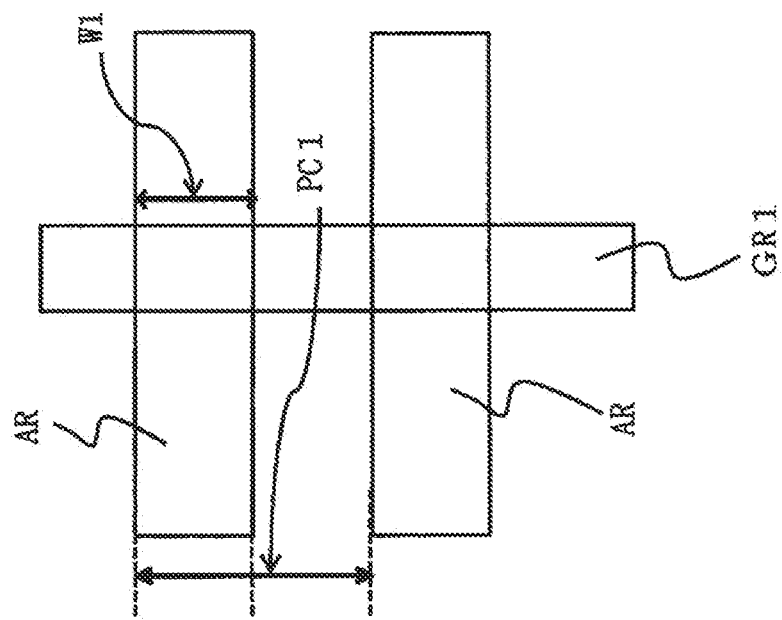
FIG. 1A is a schematic planar layout diagram showing an active region and a gate region of a MOSFET having a planer structure studied by the inventors of the present invention.

The semiconductor device according to the embodiment will be described in detail with reference to drawings. Note that the same components or corresponding components are denoted by the same reference signs in the specification and the drawings, and the repetitive description thereof will be omitted. Also, the embodiment and each modification may be combined with each other at least partially as appropriate. Further, the diagonal lines indicating that the section is not hollow in the cross-sectional views may be omitted in some cases for making the drawings easy to see. If the section is hollow, the fact that the section is hollow is apparently described in the specification.

Also, in the drawings used in the embodiment, hating is omitted in some cases in order to make the drawings easy to see. The signs "−" and "+" indicate relative concentration of the impurity of n conductivity type or p conductivity type. For example, in the case of an n-type impurity, the impurity concentration becomes higher in the order of "n<sup>−−</sup>", "n<sup>−</sup>", "n", "n<sup>+</sup>", and "n<sup>++</sup>".

First Embodiment

Before describing the semiconductor device according to the first embodiment in detail, the superiority of a memory cell configured of a FinFET having a plurality of fins arranged in parallel will be described. The effective channel width is greatly improved by using the plurality of fins arranged in parallel for 1-bit information, and the amount of charge injected per unit channel at the time of writing and erasing of a memory cell is reduced, so that the rewrite endurance and the charge storage characteristics of the memory cell can be greatly improved.

Figure 1B:
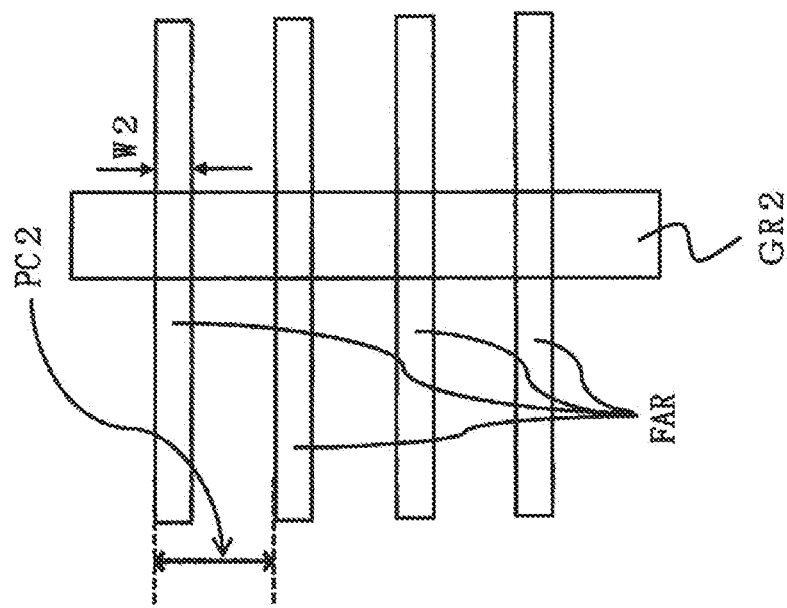
FIG. 1B is a schematic planar layout diagram showing an active region and a gate region of a 3D FinFET structure studied by the inventors of the present invention.

FIG. 1A shows a schematic planar layout showing an active region AR and a gate region GR of a typical planar MOSFET. On the other hand, FIG. 1B shows a schematic planar layout showing an active region FAR and a gate region GR2 of a typical FinFET.

In the planar MOSFET shown in FIG. 1A, the effective channel width corresponds to a channel width W1 which is the width of the semiconductor layer (impurity diffusion layer) used as the active region AR. On the other hand, in the FinFET shown in FIG. 1B, when a height of the fin is assumed to be $H_{FN}$, the effective channel width is the value obtained by adding the double of the fin height $H_{FN}$ to a fin width W2.

For example, when a cell pitch (fin pitch) PC2 that is a half of a cell pitch (fin pitch) PC1 is realized by using a patterning technology by advanced lithography such as double patterning, the effective cell pitch in the planar MOSFET is a half of the cell pitch PC1. On the other hand, the effective cell pitch in the FinFET is the value obtained by adding the quadruple of the fin height $H_{FN}$ to the double of the fin width W2.

Here, when the cell pitch PC2 and the fin height $H_{FN}$ are set to the same value, since the effective channel width is the value obtained by adding the double of the cell pitch PC2 to the double of the fin width W2, the channel width of four times or more can be secured as compared with the case of the planar MOSFET. Therefore, it can be seen that using the FinFET having a plurality of fins to configure the memory cell works extremely effectively for the suppression of the charge injection amount to the charge trapping film per unit area.

Furthermore, though described later, the effective channel width can be increased by increasing the effective fin height in the region sandwiched by the plurality of fins (in other words, reducing the height of the isolation region between the plurality of fins). With such a configuration, since the channel region that can be controlled by the memory gate electrode can be expanded in addition to the effect of increasing the number of fins, the rewrite endurance and the charge storage characteristics can be improved.

Next, the memory cell structure of the MONOS transistor will be described with reference to FIG. 2. A memory cell MC includes a control gate CG used as a word line WL, a memory gate MG used as a writing and erasing electrode, a drain region DR arranged on a side of the control gate CG and formed of an n<sup>+</sup>-type diffusion layer, and a source region SR arranged on a side of the memory gate MG and formed of an n<sup>+</sup>-type diffusion layer. The control gate CG controls a p-type channel forming layer CGC under the control gate CG formed on a surface of a p-type substrate PSUB by the field effect via a gate dielectric film GI, and the memory gate MG controls an n-type channel MGC under the memory gate MG via a charge trapping film CTF.

Also, a predetermined potential is supplied to each of the drain region DR, the source region SR, the p-type substrate PSUB, and the memory gate MG via a bit line BL, a source line SL, a substrate potential line VSUB, and a sub-word line SWL. Generally, the names of source and drain are used depending on the flow direction of channel carrier, but since the split-gate type MONOS has an asymmetric structure, the names of source and drain are used as electrode names of specific diffusion layers here for convenience. Therefore, the carrier may flow from the drain electrode to the source electrode depending on the operation mode.

In the split-gate type MONOS, electrons are injected into the charge trapping film by the vertical electric field by using the SSI (Source Side Injection) in the writing. In the erasing, holes are injected into the charge trapping film by accelerating the holes generated by the band to band tunnel at the end of the diffusion layer (source) by the horizontal electric field of the MG channel.

Figure 2:
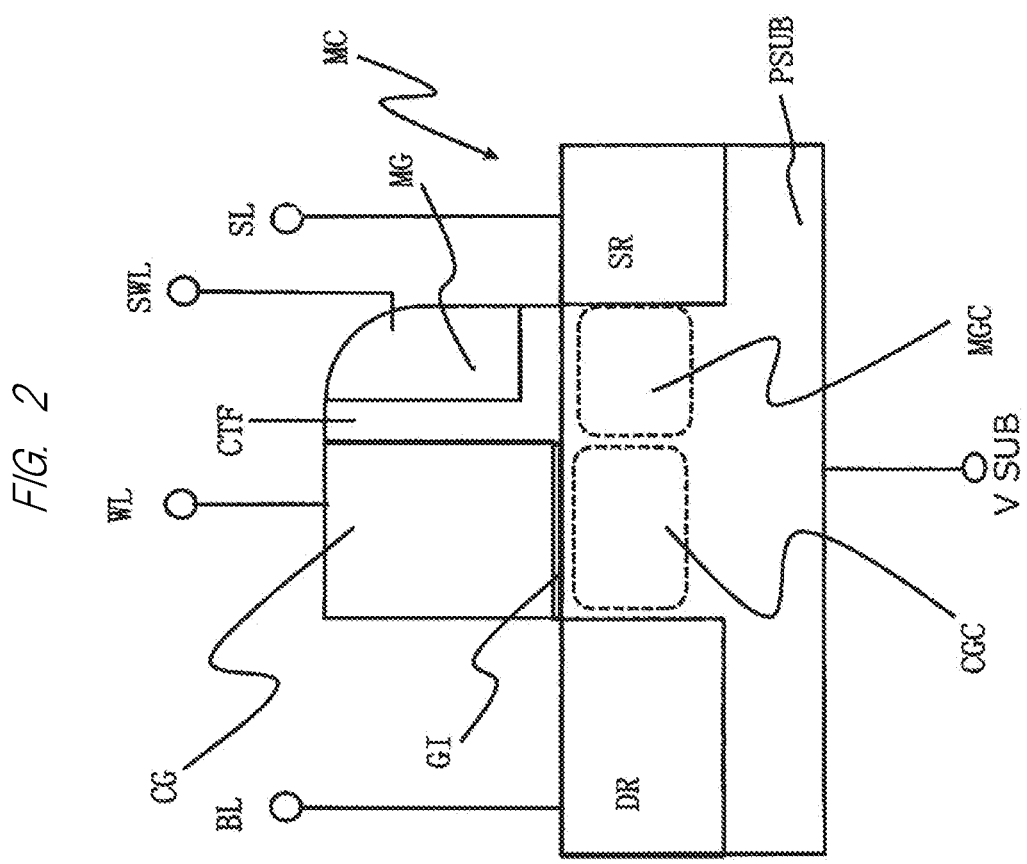
FIG. 2 is a cross-sectional view showing a principal part of a split-gate type MONOS memory cell studied by the inventors of the present invention.
Figure 4B:
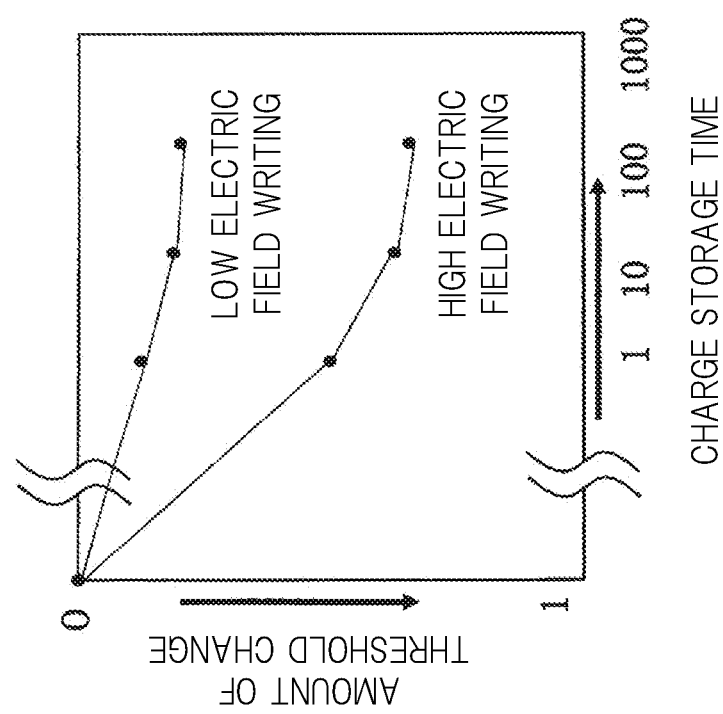
FIG. 4B is a diagram showing a correlation of the charge storage time and the amount of threshold change in the high electric field and the low electric field sturdied by the inventors of the present invention.

FIG. 3 shows operation modes of a typical memory cell having the split-gate type MONOS structure shown in FIG. 2. The bias conditions at the terminals in the respective operations are shown by signs such as a ground potential GND and a power supply voltage Vcc in the upper table A of FIG. 3, and are shown by specific voltage (unit: V) examples in the device assuming the voltage of 1.5 V in the lower table B of FIG. 3. Since the writing uses the source side injection method and hot carrier electrons generated in the channel are injected into the charge trapping film, the channels of the selection transistor and the memory transistor are brought into an on state and a high memory gate voltage VMG is applied.

On the other hand, since holes are generated by the band to band tunnel phenomenon by the electric field between the source line SL and the memory gate MG in the erasing, a negative memory gate voltage VMG is applied. The generated holes are accelerated by the electric field to inject them into the charge trapping film, thereby performing the erasing. In the reading operation, the selection transistor is brought into an on state by setting the source line SL to the ground potential, setting the bit line BL to the power supply voltage, and applying the power supply voltage to the control gate CG, and the operation of the non-volatile memory cell is obtained by reading the charge trapping state of the memory gate MG as a magnitude of the current value. In the first embodiment, reducing the bias VMG ($V_{mgp}$) of the memory gate MG in the writing is one important purpose.

Next, the semiconductor device according to the first embodiment will be described in detail with reference to FIG. 5 and FIG. 6. First, a typical operation in the case where a non-volatile memory allay is configured by using the semiconductor device having a split-gate type MONOS structure will be described.

Figure 5:
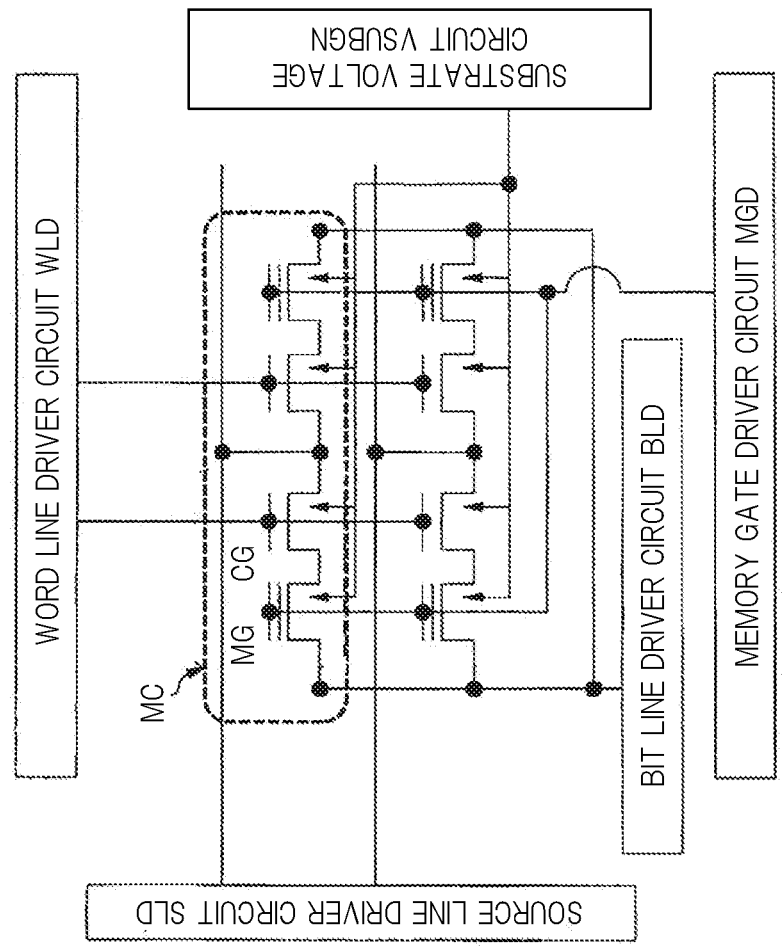
FIG. 5 is a circuit diagram showing a memory module configuration according to the embodiment.

FIG. 5 shows a typical array configuration. FIG. 5 shows an example of a non-volatile memory module and is an equivalent circuit diagram showing a connection relationship of four memory cells MC of a plurality of memory cells MC.

Each control gate CG is electrically connected to a word line driver circuit WLD for control gate CG, each memory gate MG is electrically connected to a memory gate driver circuit MGD for memory gate MG, the source region SR is electrically connected to a source line driver circuit SLD for source line, and the drain region DR is electrically connected to a bit line driver circuit BLD for bit line. Also, a predetermined potential is applied to a semiconductor substrate PSUB by a substrate voltage circuit VSUBGN.

Figure 6:
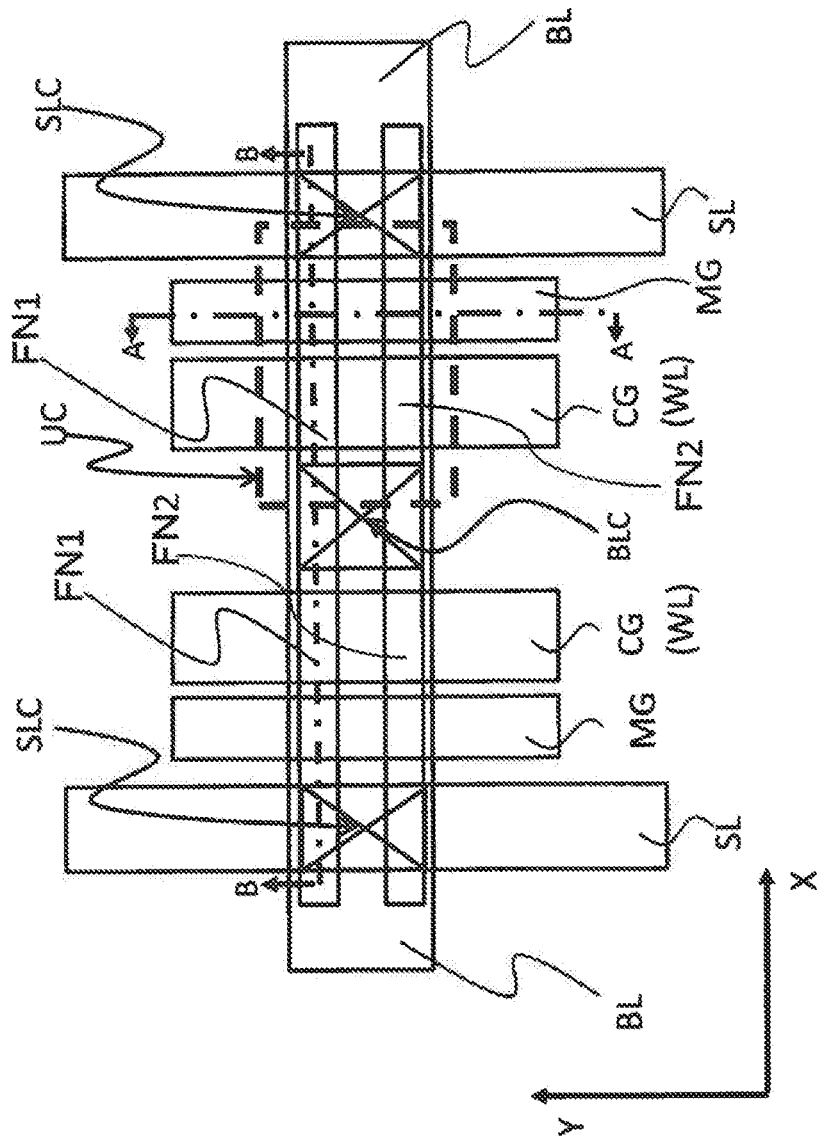
FIG. 6 is a planar layout diagram showing a split-gate type MONOS using a FinFET according to the embodiment.

FIG. 6 shows an example of a planar layout of the memory cell array shown in FIG. 5. FIG. 6 shows a planar layout corresponding to two memory cells surrounded by a dotted line MC shown in FIG. 5.

Also, in FIG. 6, a part surrounded by a dotted line UC indicates a unit cell UC corresponding to one memory cell, and the unit cell UC includes a first fin FN1 and a second fin FN2 extending in a first direction X in plan view, the memory gate MG and the control gate CG extending in a second direction Y in plan view, a source line contact SLC commonly connected to source regions formed in the first fin FN1 and the second fin FN2, and a bit line contact BLC commonly connected to drain regions formed in the first fin FN1 and the second fin FN2.

Figure 7:
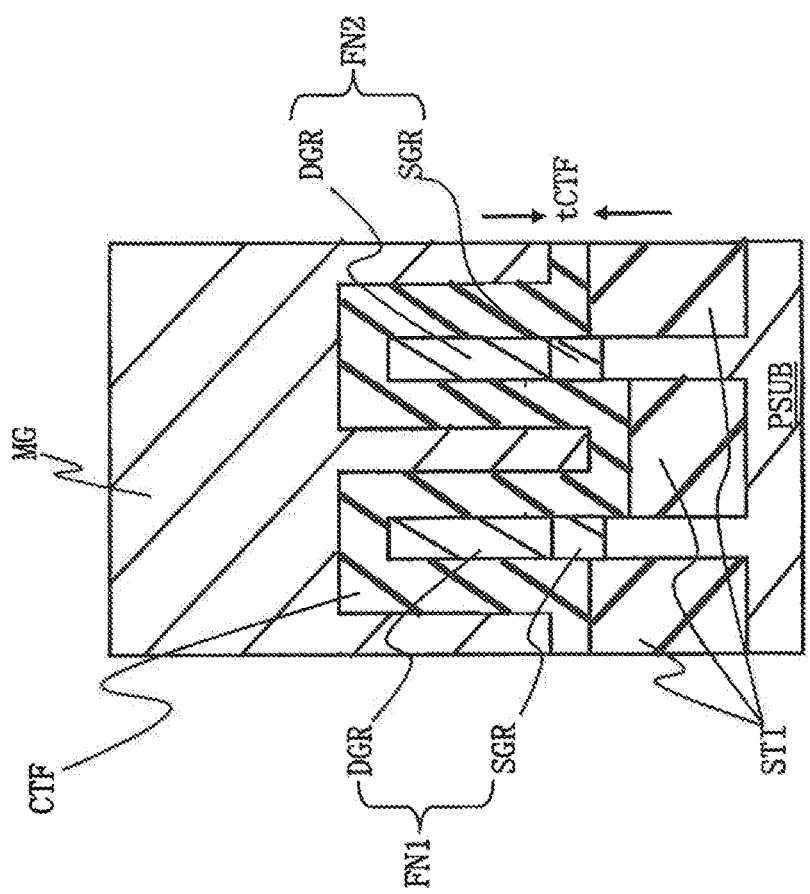
FIG. 7 is a cross-sectional view showing a principal part of a unit cell UC corresponding to a line A-A in FIG. 6.

FIG. 7 shows a cross-sectional structure corresponding to a one-dot chain line A-A in FIG. 6. As shown in FIG. 7, one feature of the semiconductor device according to the first embodiment is that an upper surface height of an isolation region STI in a region sandwiched between the two fins FN1 and FN2 is made lower than those of upper surfaces of isolation regions STI located outside the fins FN1 and FN2.

As is apparent from FIG. 7, the region to be the effective channel is composed of two regions such as a double gate control region DGR sandwiched by the memory gate MG and a single gate control region SGR controlled by a part of the memory gate MG located in a region sandwiched between the two fins FN1 and FN2, and it is thus possible to increase the effective channel width.

For example, when the charge trapping film CTF is configured of a stacked film of a silicon oxide film, a silicon nitride film, and a silicon oxide film and the film thickness thereof is set to 20 nm, the upper surface of the isolation region STI between the fins FN1 and FN2 should be formed to be lower than those outside the fins FN1 and FN2 by 20 nm. As compared with the double gate control region DGR, the single gate control region SGR is slightly inferior in controllability by the memory gate MG, but since the current driving force is more prioritized than the switching operation in the charge accumulation memory, it is important to increase the effective channel width.

Figure 8:
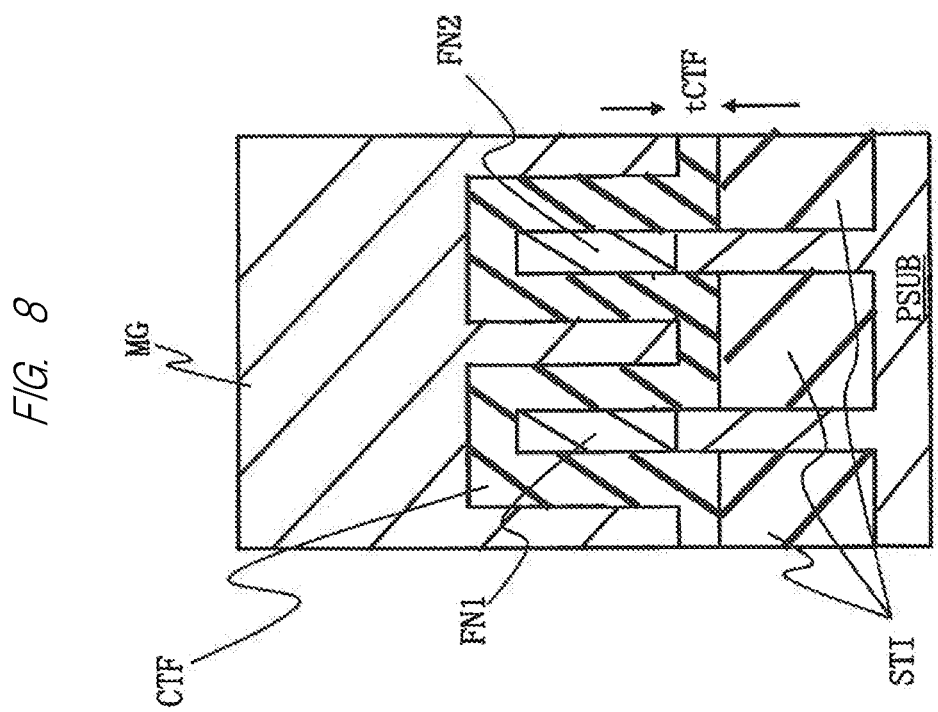
FIG. 8 is a cross-sectional view showing a principal part of a comparative example of FIG. 7.

For comparison, FIG. 8 shows a comparative example in which the upper surface height of the isolation region STI in the region sandwiched between the two fins FN1 and FN2 is made equal to the heights of the isolation regions STI located outside the fins FN1 and FN2.

In the case of the structure shown in FIG. 8, in the lower portions of the fins FN1 and FN2, both sides of the fins are sandwiched by only the charge trapping film. In other words, since the substrate PSUB constituting the lower portions of the fins FN1 and FN2 has a region where the memory gate MG cannot be arranged, the field effect by the memory gate MG is hard to act on the channel in this region and it is difficult to achieve the good controllability.

Note that, in the first embodiment, the operation of the memory cell in the case where the selection transistor having the control gate is an NMOS has been described as the memory cell operation in the split-gate type MONOS structure, but in the memory cell in the case where the selection transistor is a PMOS, the same effect as the case of the above-mentioned NMOS can be obtained by inverting the positive and negative signs for the bias conditions.

Next, the manufacturing method of the semiconductor device according to the first embodiment will be described with reference to FIG. 9 to FIG. 24.

Figure 9:
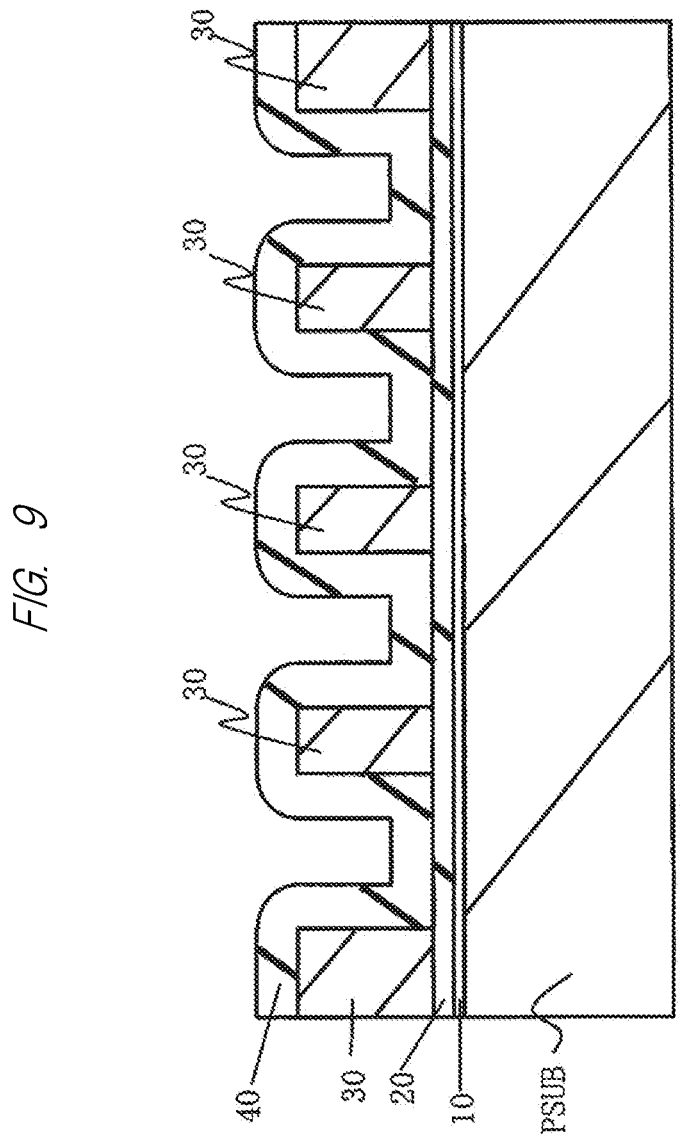
FIG. 9 is a cross-sectional view showing a principal part in the manufacturing process of a memory cell using a FinFET having a split-gate type MONOS according to the embodiment.

As shown in FIG. 9, a silicon oxide film 10, a silicon nitride film 20, and an amorphous carbon layer 30 are sequentially formed on the semiconductor substrate PSUB made of p-type silicon, and the amorphous carbon layer 30 is patterned by, for example, the selective etching process using a resist pattern. Thereafter, a silicon nitride film 40 is formed on the semiconductor substrate PSUB so as to cover the amorphous carbon layer 30.

Figure 10:
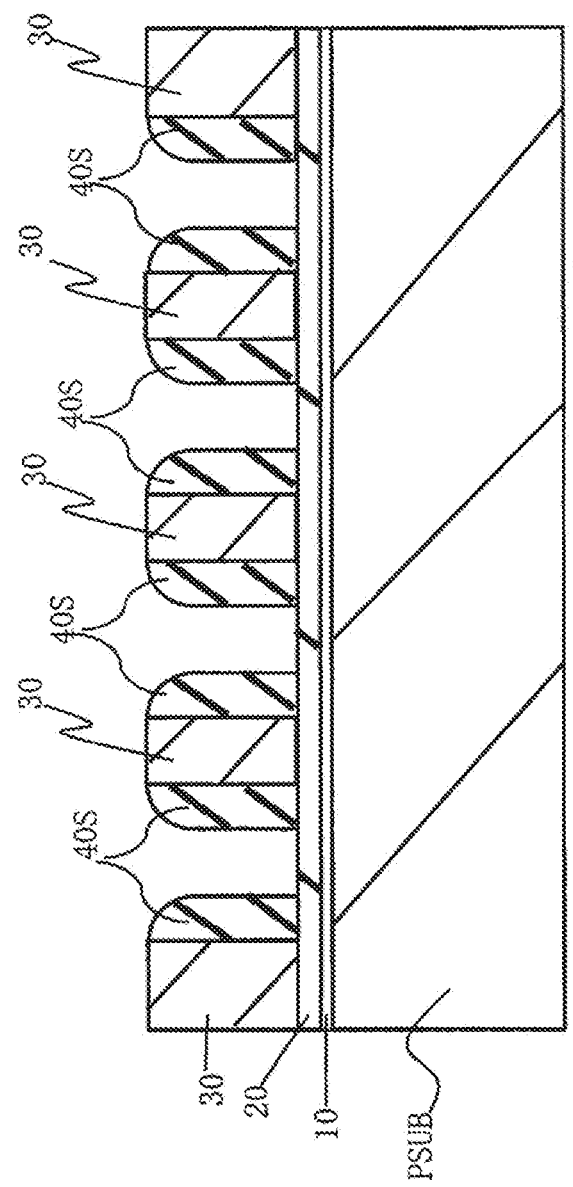
FIG. 10 is a cross-sectional view showing a principal part in the manufacturing process of the memory cell using the FinFET having the split-gate type MONOS following FIG. 9.

Next, by performing the anisotropic etching to the silicon nitride film 40, spacers 40 formed of the silicon nitride film are formed as shown in FIG. 10.

Figure 11:
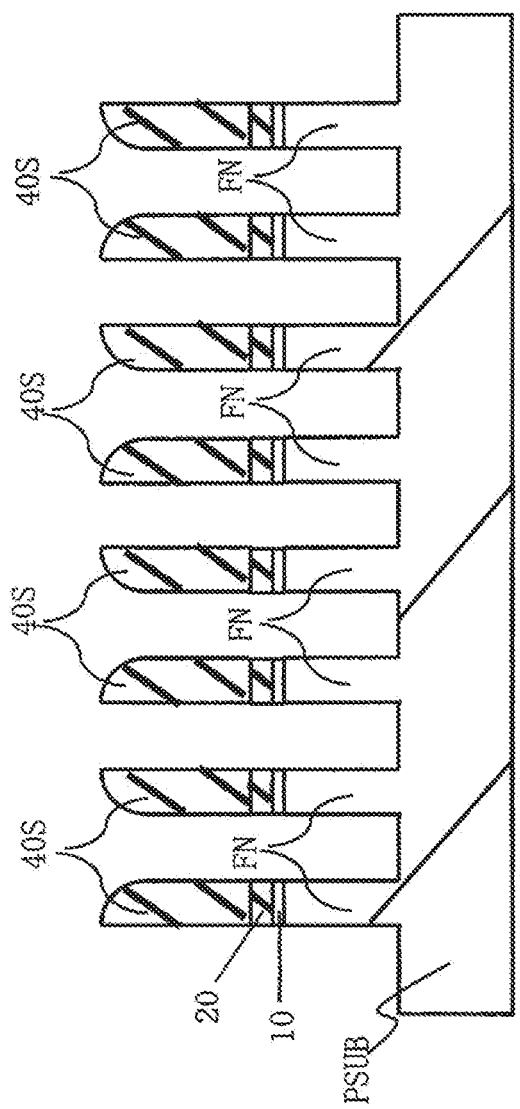
FIG. 11 is a cross-sectional view showing a principal part in the manufacturing process of the memory cell using the FinFET having the split-gate type MONOS following FIG. 10.

Next, the amorphous carbon layer 30 is removed and the upper surface of the semiconductor substrate PSUB is selectively etched with using the spacers 40 as a mask, thereby forming the plurality of fins FN made of silicon as shown in FIG. 11.

Figure 12:
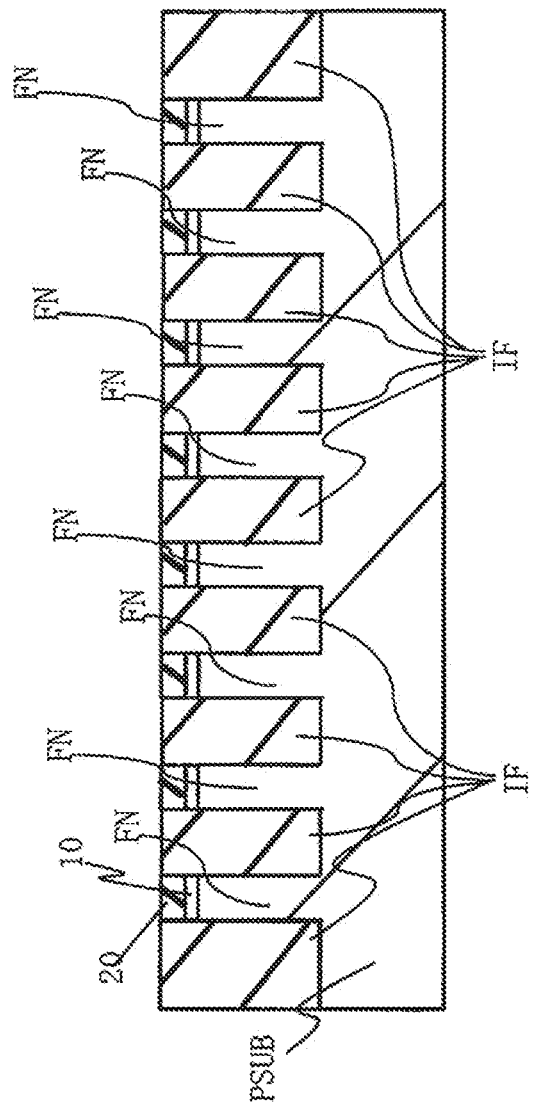
FIG. 12 is a cross-sectional view showing a principal part in the manufacturing process of the memory cell using the FinFET having the split-gate type MONOS following FIG. 11.

Next, an insulating film formed of, for example, a silicon oxide film is deposited on the entire surface of the semiconductor substrate PSUB and the silicon oxide film is etched back by the CMP (Chemical Mechanical Polishing) method, thereby forming the insulating film IF to be the isolation region STI later so as to fill the spaces between the fins FN as shown in FIG. 12.

Figure 13:
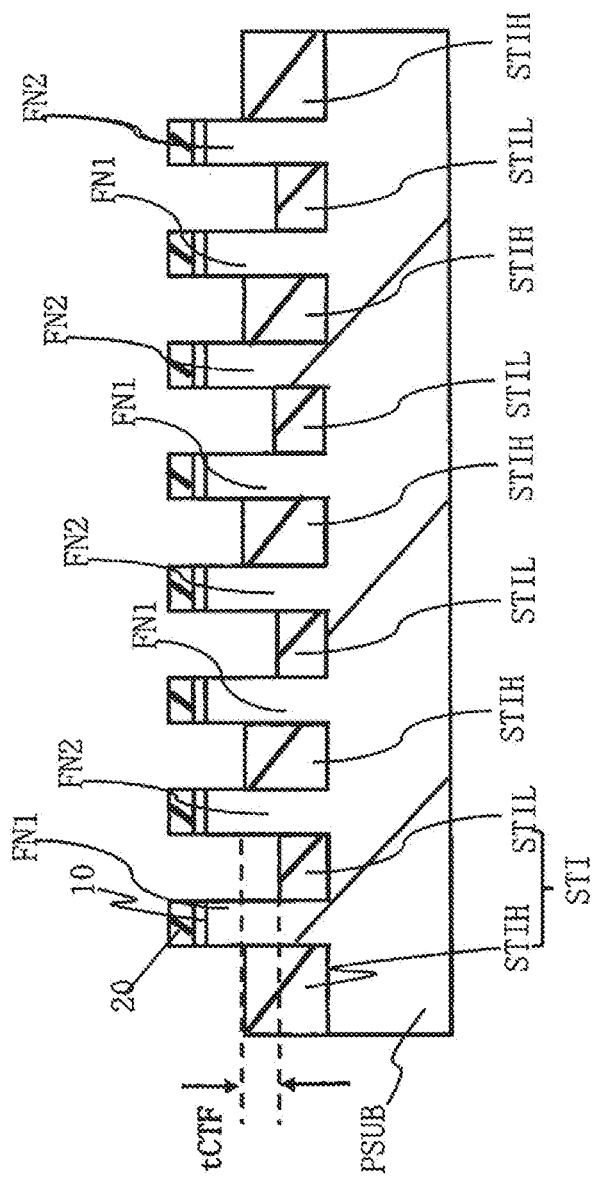
FIG. 13 is a cross-sectional view showing a principal part in the manufacturing process of the memory cell using the FinFET having the split-gate type MONOS following FIG. 12.

Next, for example, the selective etching using a resist pattern as a mask is performed to the insulating film IF buried in the spaces between the fins FN, thereby forming the isolation regions STI as shown in FIG. 13. The isolation regions STI include a first isolation region STIL arranged in a region between the first fin FN1 and the second fin FN2 and having a lower upper surface height and a second isolation region STIH arranged in a region outside the first fin FN1 and the second fin FN2 and having a higher upper surface height. The upper surface height of the first isolation region STIL is set to a position lower than the upper surface height of the second isolation region STIH by the thickness corresponding to the film thickness tCTF (see FIG. 8) of the charge trapping film CTF.

For example, when the charge trapping film to be formed later is formed of a stacked film of a silicon oxide film, a silicon nitride film, and a silicon oxide film and the film thickness thereof is set to 20 nm, the selective etching of the insulating film IF is performed such that the upper surface of the first isolation region STIL is made lower than the upper surface of the second isolation region STIH by 20 nm.

As described above, by the process up to FIG. 13, the isolation structure as a base structure to form the FinFET is completed. Note that the description of the manufacturing method after the completion of the isolation structure will be continued as the manufacturing method of the part corresponding to the cross-sectional structure in a one-dot chain line B-B in the planar layout shown in FIG. 6. Note that the cross-sections corresponding to each one-dot chain line C-C in FIG. 14A to FIG. 25A are shown in FIG. 14B to FIG. 25B, respectively.

Figure 14A:
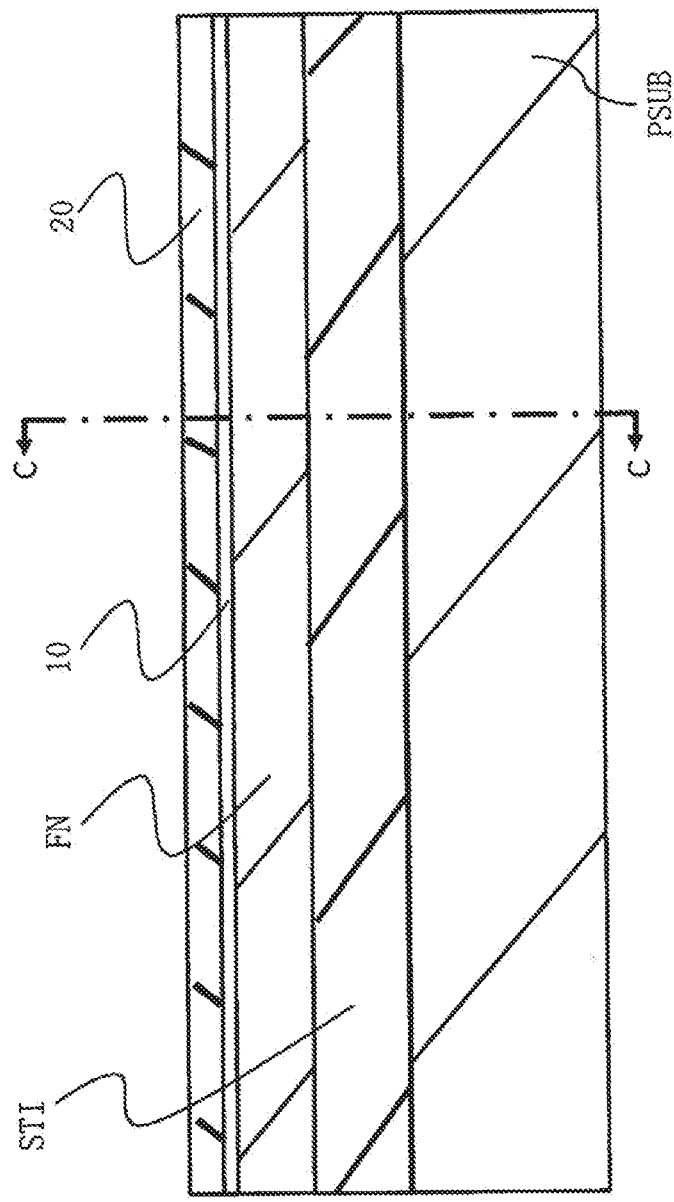
FIG. 14A is a cross-sectional view showing a principal part in the manufacturing process of the memory cell using the FinFET having the split-gate type MONOS following FIG. 13.
Figure 14B:
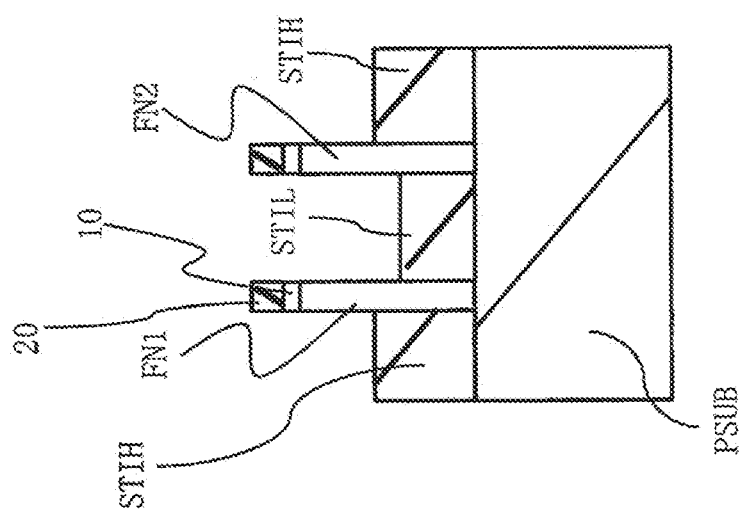
FIG. 14B is a cross-sectional view showing a principal part corresponding to a one-dot chain line C-C in FIG. 14A.

As shown in FIG. 14A and FIG. 14B, the fin FN1 and the fin FN2 are formed so as to extend in the first direction X in FIG. 6.

Figure 15A:
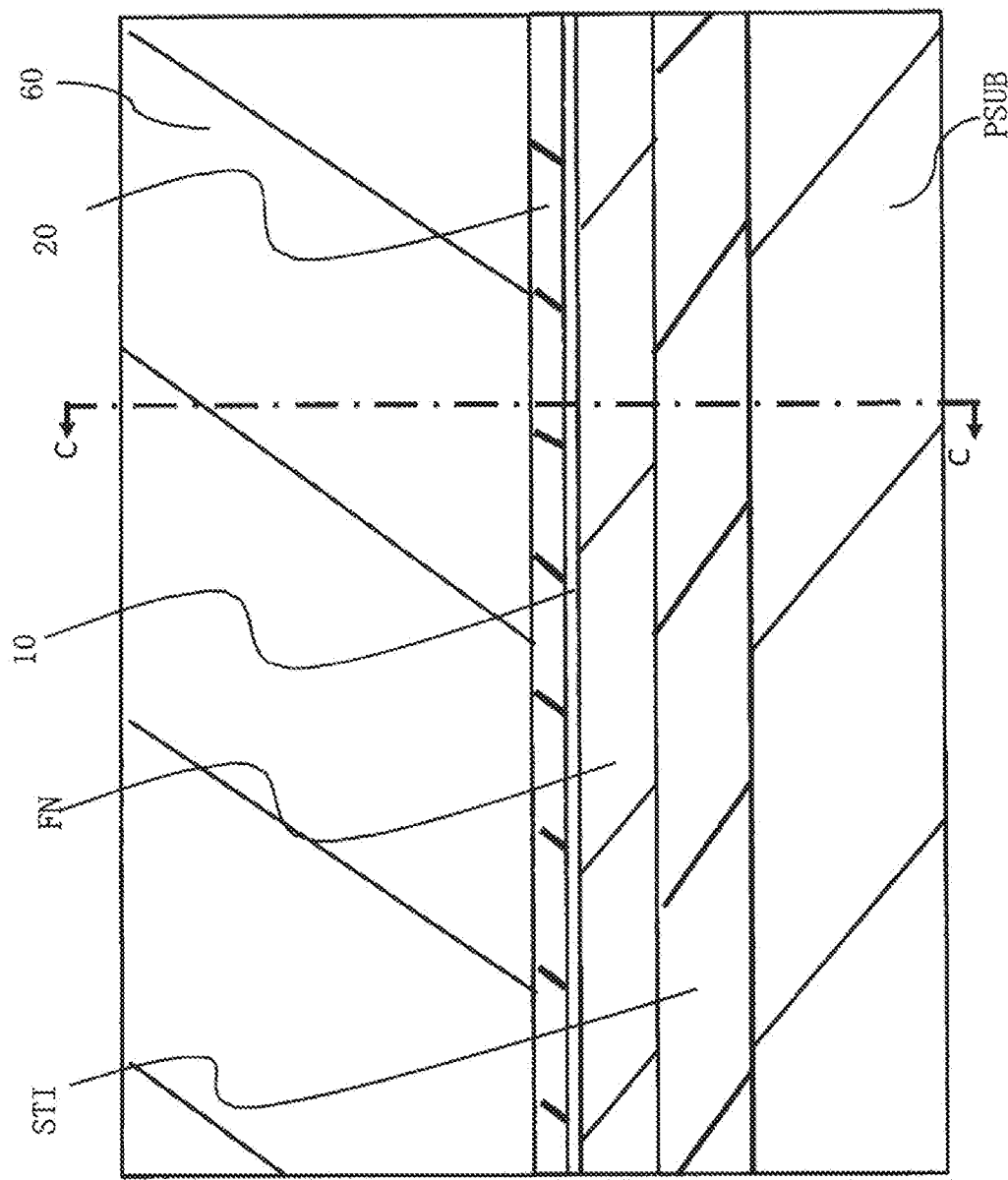
FIG. 15A is a cross-sectional view showing a principal part in the manufacturing process of the memory cell using the FinFET having the split-gate type MONOS following FIG. 14A.

Next, after performing the process of removing a natural oxide film on the silicon surface on the side surfaces of the fins FN by the wet etching, as shown in FIG. 15A and FIG. 15B, a gate dielectric film 50 is formed so as to cover the main surfaces of the fins FN, a gate material 60 to be a material to form the control gate CG is deposited on the gate dielectric film 50, and then an upper surface of the gate material 60 is planarized by the CMP method. For example, a silicon oxide film is used as the gate dielectric film 50 and polycrystalline silicon is used as the gate material 60. The gate material 60 may be a stacked structure of polycrystalline silicon and a metal film such as titanium nitride.

Figure 16A:
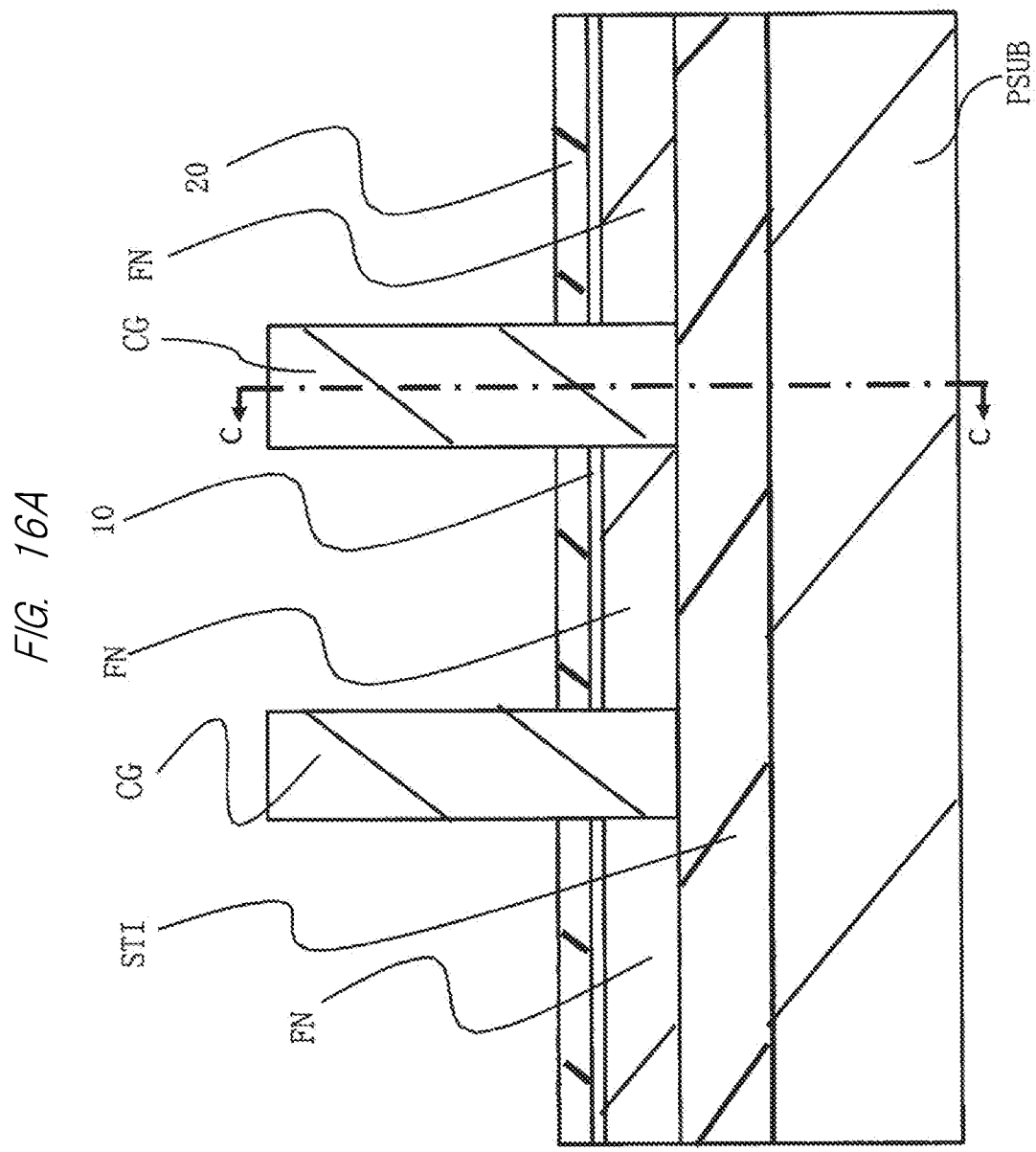
FIG. 16A is a cross-sectional view showing a principal part in the manufacturing process of the memory cell using the FinFET having the split-gate type MONOS following FIG. 15A.
Figure 16B:
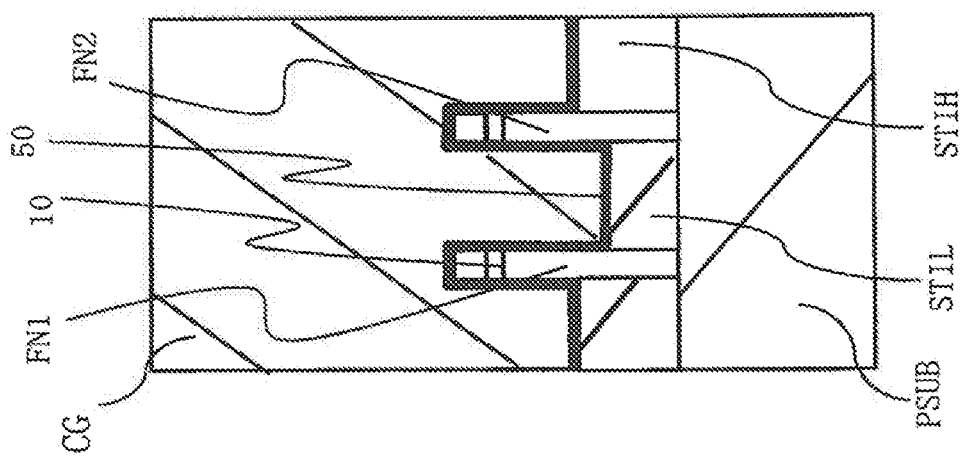
FIG. 16B is a cross-sectional view showing a principal part corresponding to the one-dot chain line C-C in FIG. 16A.

Next, after the gate material 60 is patterned by using the photolithography and etching technology, as shown in FIG. 16A and FIG. 16B, the gate material 60 is processed vertically with respect to the semiconductor substrate PSUB by the selective etching, thereby forming the control gate CG. At this time, the side surfaces of the fins are sufficiently exposed by overetching.

Figure 17A:
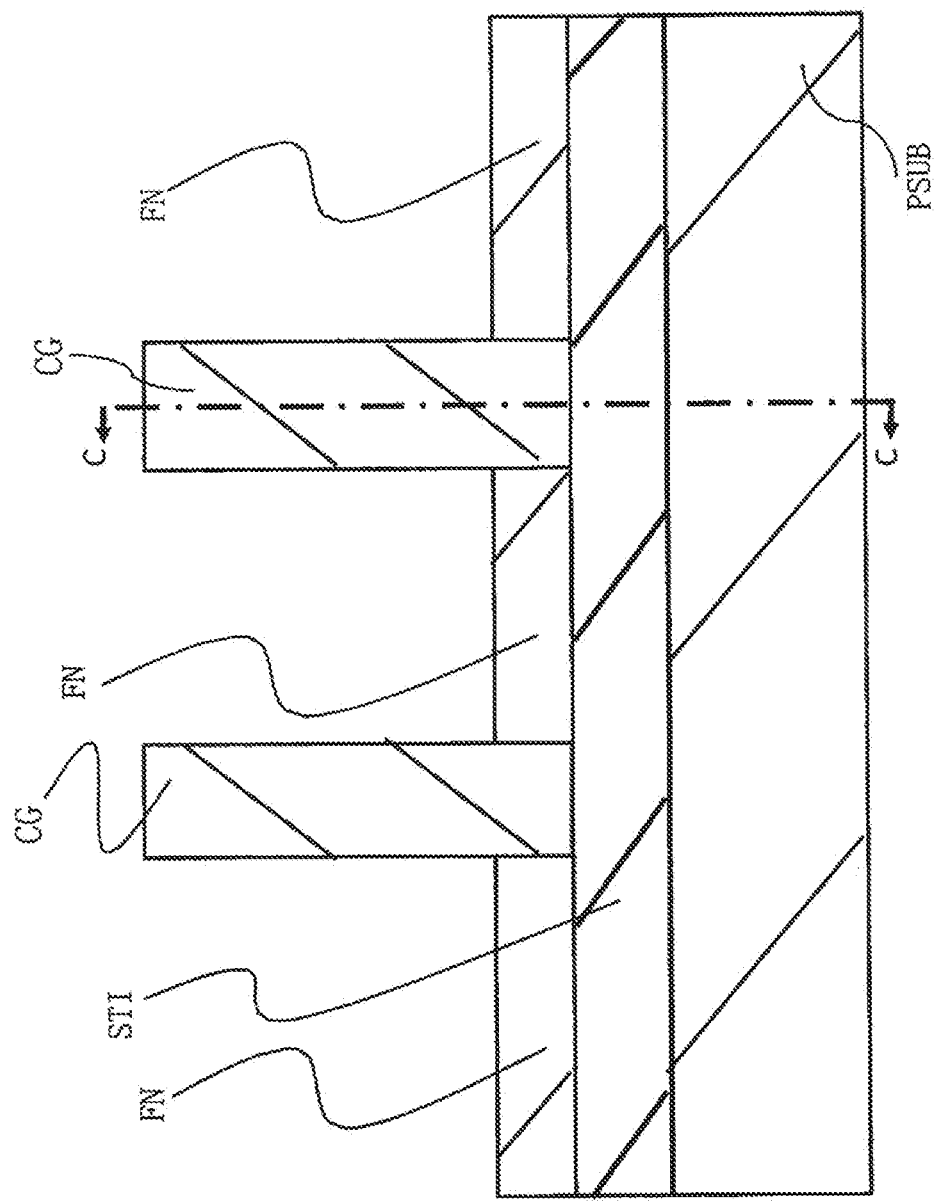
FIG. 17A is a cross-sectional view showing a principal part in the manufacturing process of the memory cell using the FinFET having the split-gate type MONOS following FIG. 16A.
Figure 17B:
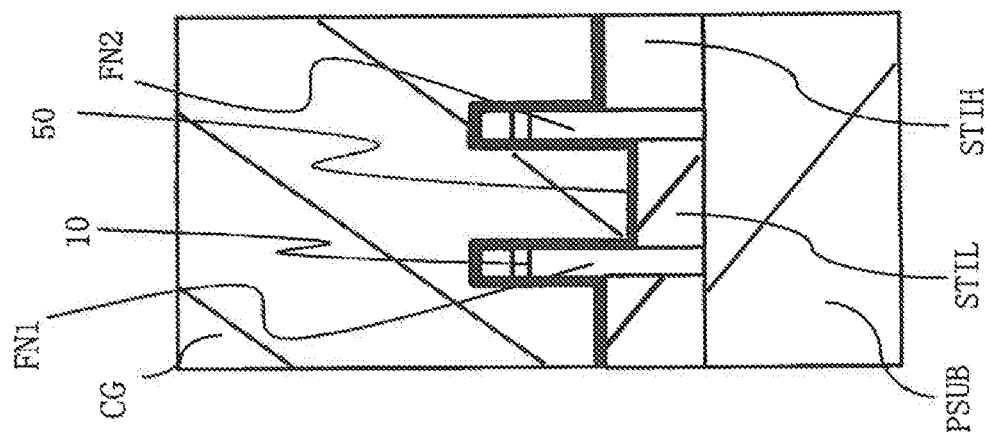
FIG. 17B is a cross-sectional view showing a principal part corresponding to the one-dot chain line C-C in FIG. 17A.

Next, the silicon nitride film (insulating film) 20 and the silicon oxide film (insulating film) 10 which are the cover layers on the exposed fins FN are removed by using the etching technology, thereby obtaining the structure shown in FIG. 17A and FIG. 17B.

Figure 18A:
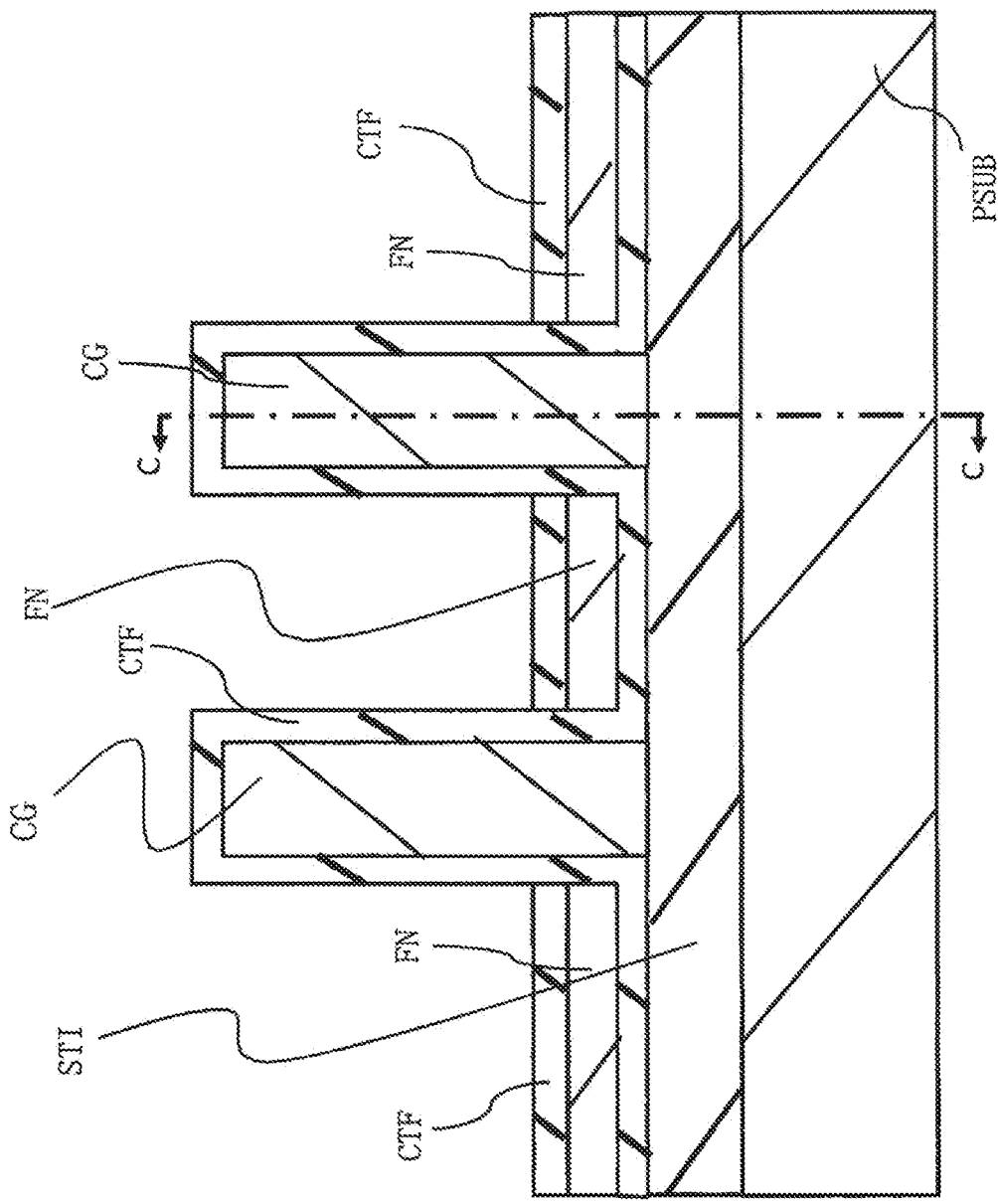
FIG. 18A is a cross-sectional view showing a principal part in the manufacturing process of the memory cell using the FinFET having the split-gate type MONOS following FIG. 17A.

Next, as shown in FIG. 18A and FIG. 18B, the charge trapping film CTF is formed on the fins FN. The charge trapping film CTF is formed of, for example, a stacked structure of a silicon oxide film, a silicon nitride film, and a silicon oxide film. Note that, as a material of the charge trapping film CTF, a stacked structure of a silicon oxide film, a hafnium oxide film, an alumina oxide film, a hafnium silicate film, and an aluminum silicate film can be used.

Figure 19A:
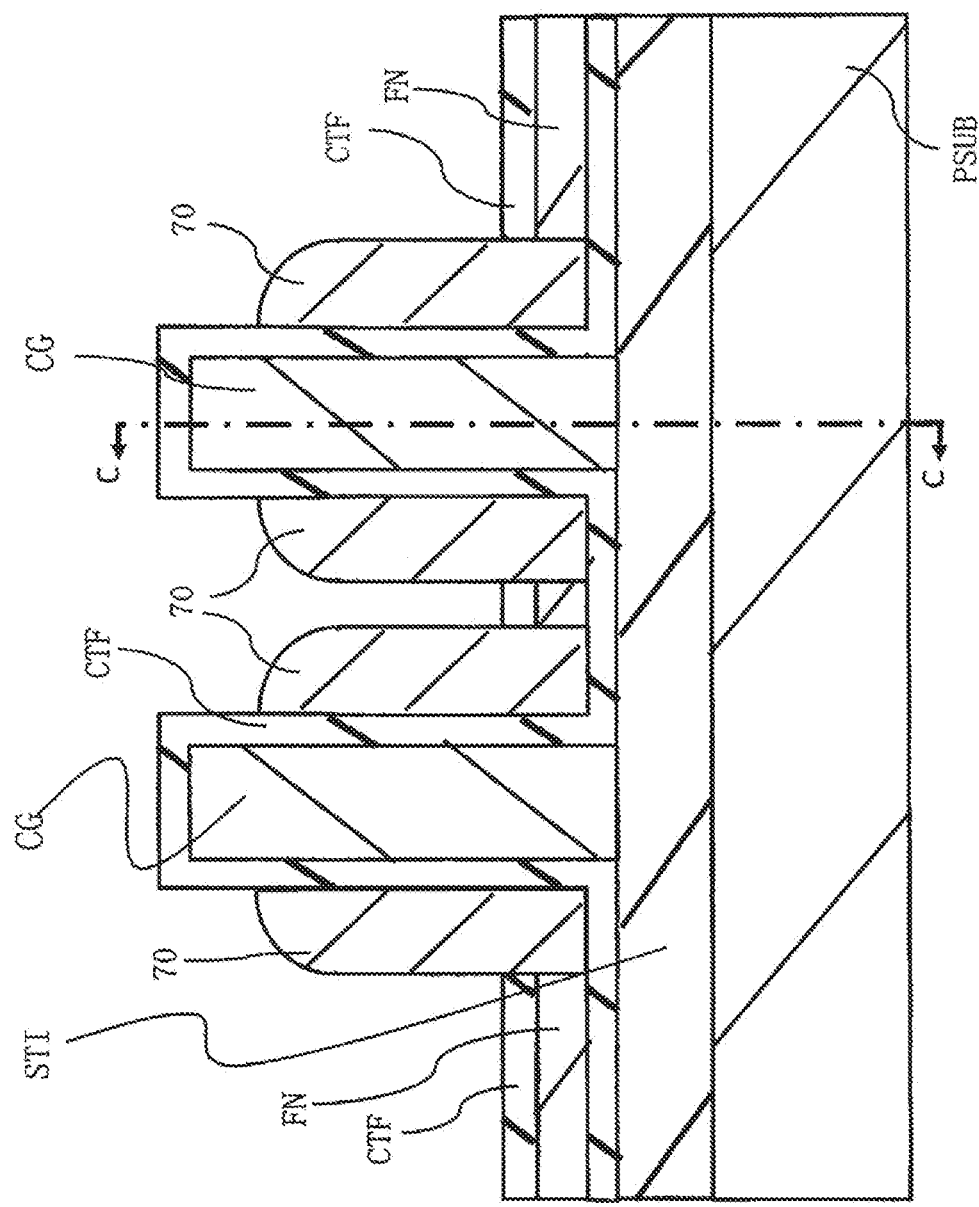
FIG. 19A is a cross-sectional view showing a principal part in the manufacturing process of the memory cell using the FinFET having the split-gate type MONOS following FIG. 18A.
Figure 19B:
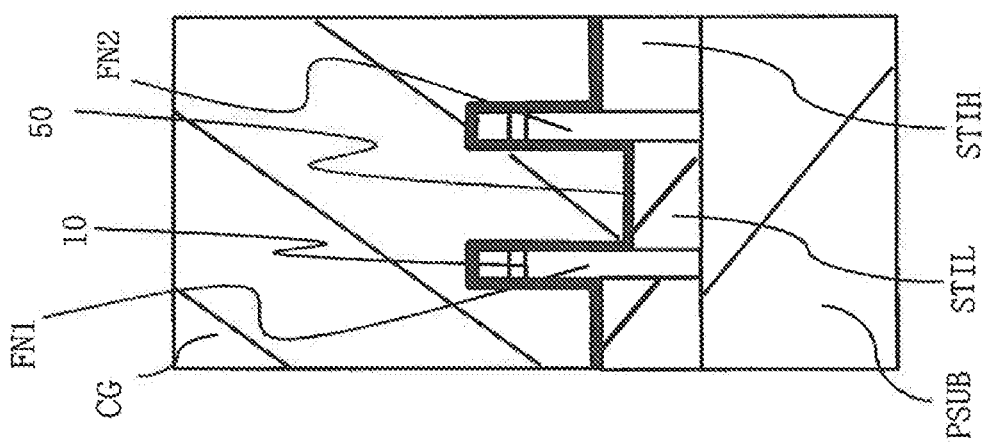
FIG. 19B is a cross-sectional view showing a principal part corresponding to the one-dot chain line C-C in FIG. 19A.

Next, a gate material made of polycrystalline silicon to be the memory gate MG is deposited on the entire surface of the semiconductor substrate PSUB including the control gate CG by the CVD method, and the gate material is anisotropically etched, thereby forming spacer structures 70 on the side surfaces of the control gate CG as shown in FIG. 19A and FIG. 19B. In this anisotropic etching, the overetching corresponding to the height of the fin is performed such that the gate material of the memory gate MG is not left on the side surfaces of the fin FN.

Figure 20A:
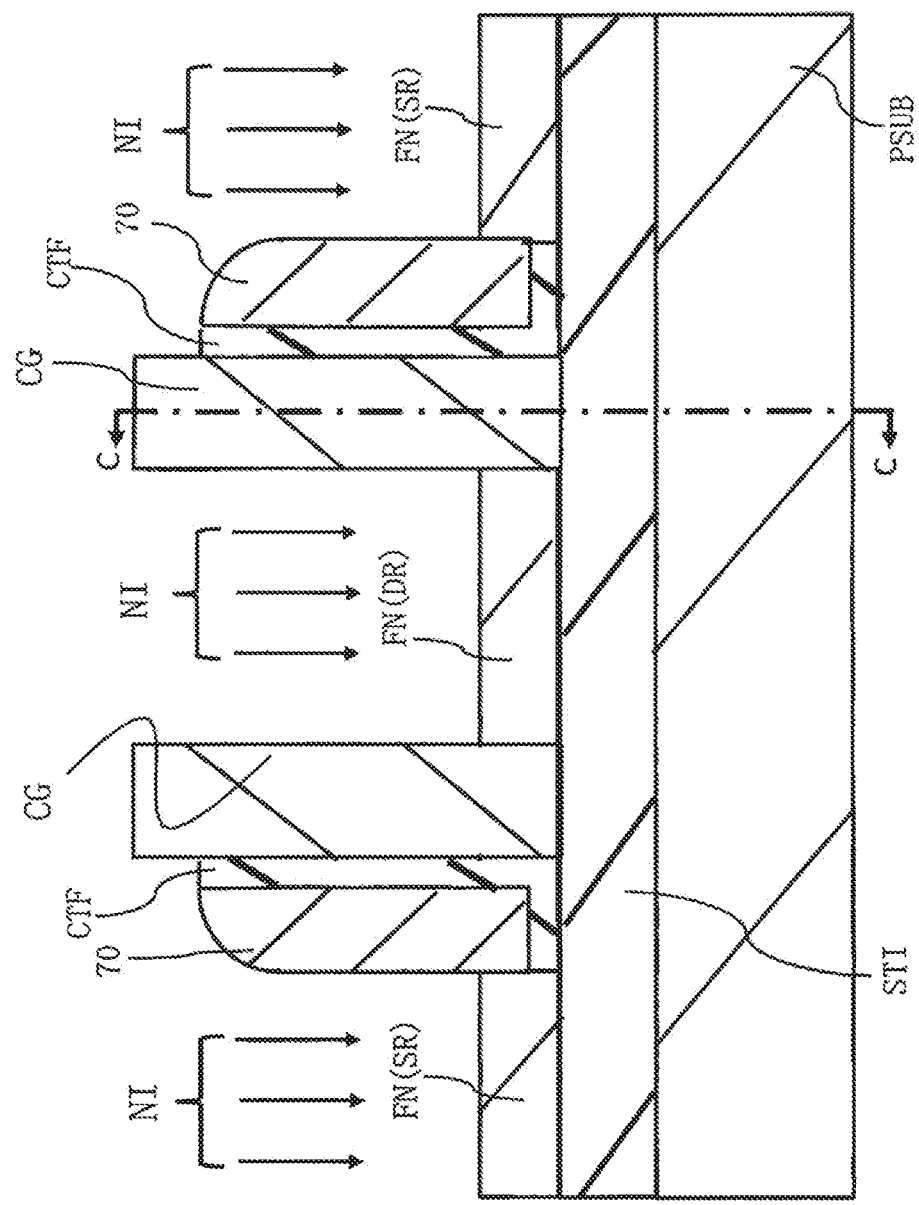
FIG. 20A is a cross-sectional view showing a principal part in the manufacturing process of the memory cell using the FinFET having the split-gate type MONOS following FIG. 19A.
Figure 20B:
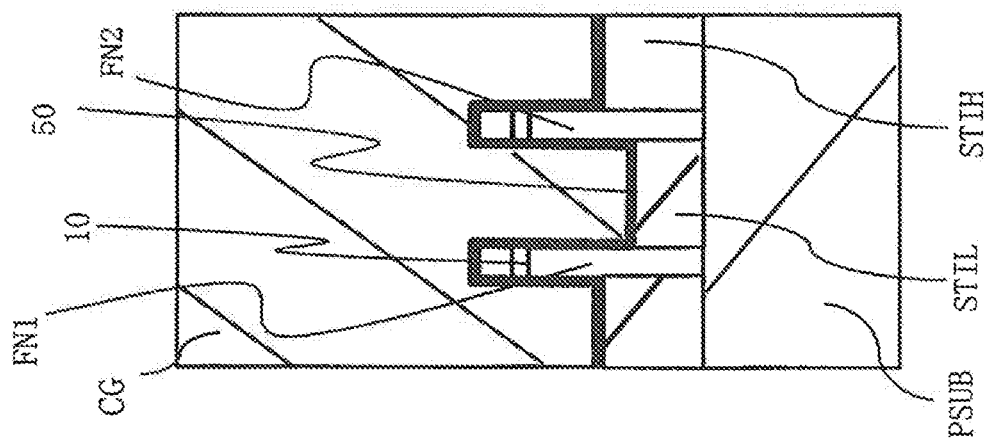
FIG. 20B is a cross-sectional view showing a principal part corresponding to the one-dot chain line C-C in FIG. 20A.

Next, after the spacer structures 70 formed between the control gates CG are selectively removed, the charge trapping film is selectively removed as shown in FIG. 20A and FIG. 20B. The selective removal of the charge trapping film can be performed by the wet etching using the spacer structure 70 left on one side of the control gate CG as a mask. In this state, an n-type impurity NI (for example, arsenic) is selectively ion-implanted into the fins FN with using the spacer structure 70 and the control gate CG as a mask for impurity introduction, thereby forming the n$^+$-type source region SR and the n$^+$-type drain region DR in the fins FN.

Figure 21A:
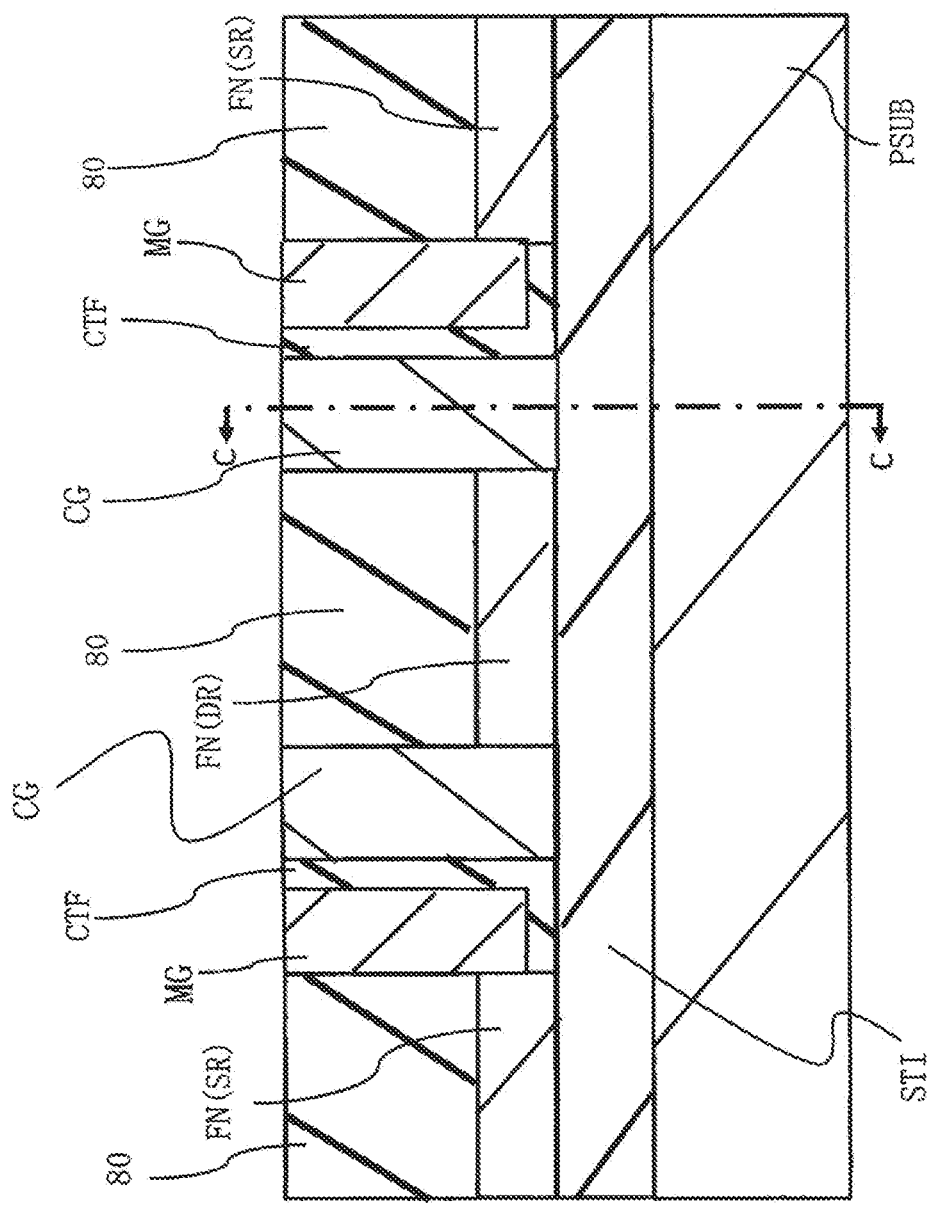
FIG. 21A is a cross-sectional view showing a principal part in the manufacturing process of the memory cell using the FinFET having the split-gate type MONOS following FIG. 20A.
Figure 21B:
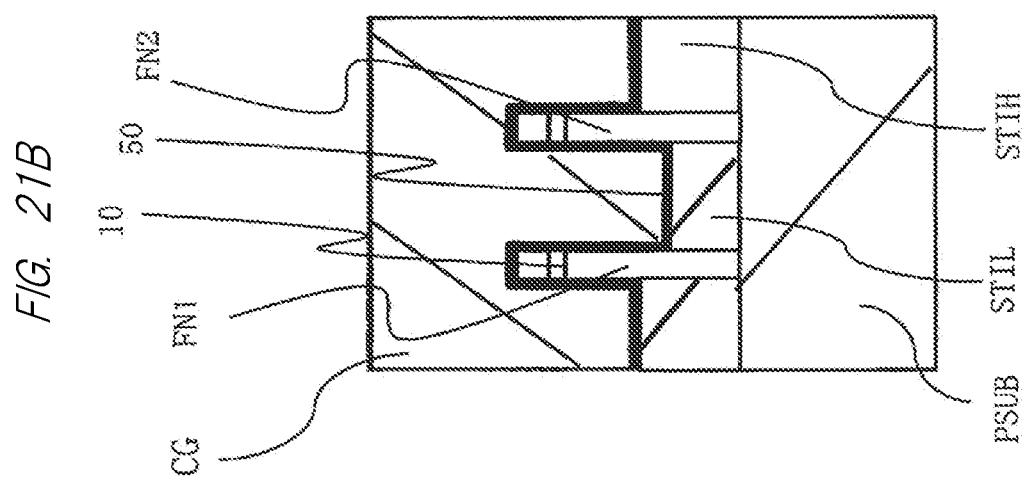
FIG. 21B is a cross-sectional view showing a principal part corresponding to the one-dot chain line C-C in FIG. 21A.

Next, a silicon oxide film is deposited to about 500 nm over the entire surface of the semiconductor substrate PSUB, and the silicon oxide film is polished by the CMP method, thereby planarizing the top portions of the control gate CG and the memory gate MG and forming an interlayer insulating film 80 so as to fill the regions other than the control gate CG and the memory gate MG as shown in FIG. 21A and FIG. 21B.

Figure 22B:
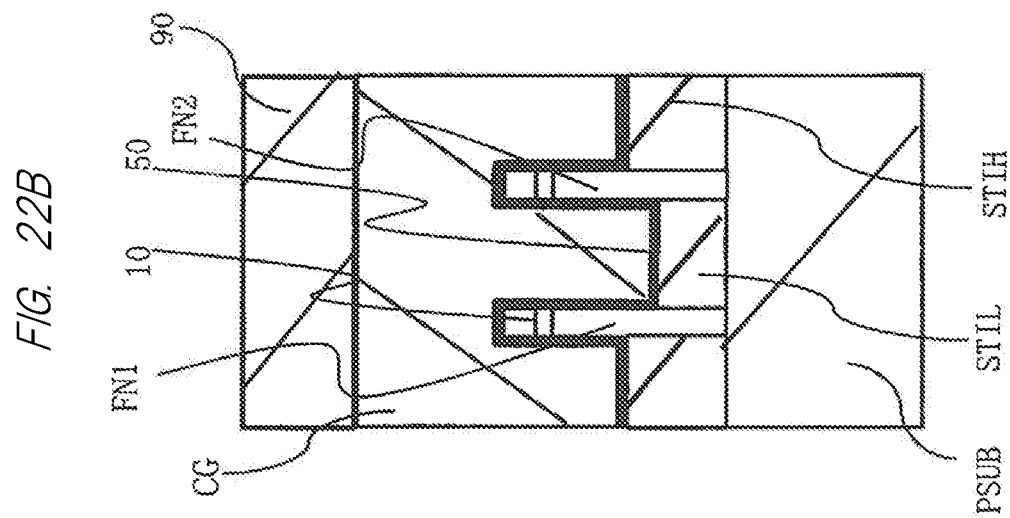
FIG. 22B is a cross-sectional view showing a principal part corresponding to the one-dot chain line C-C in FIG. 22A.

Next, a silicon oxide film is formed by, for example, the CVD method over the entire surface of the semiconductor substrate PSUB, thereby forming an interlayer insulating film 90. Thereafter, contact holes are formed in the interlayer insulating film 90 and the interlayer insulating film 80, and the bit line contact BLC and the source line contact SLC made of a metal material such as tungsten are formed so as to fill the contact holes as shown in FIG. 22A and FIG. 22B. The bit line contact BLC is electrically connected to the drain region DR formed in each of the two fins (FN1, FN2) arranged at a predetermined interval as shown in FIG. 6, thereby forming a common drain. Also, the source line contact SLC is electrically connected to the source region SR formed in each of the two fins (FN1, FN2) as shown in FIG. 6, thereby forming a common source.

Figure 23A:
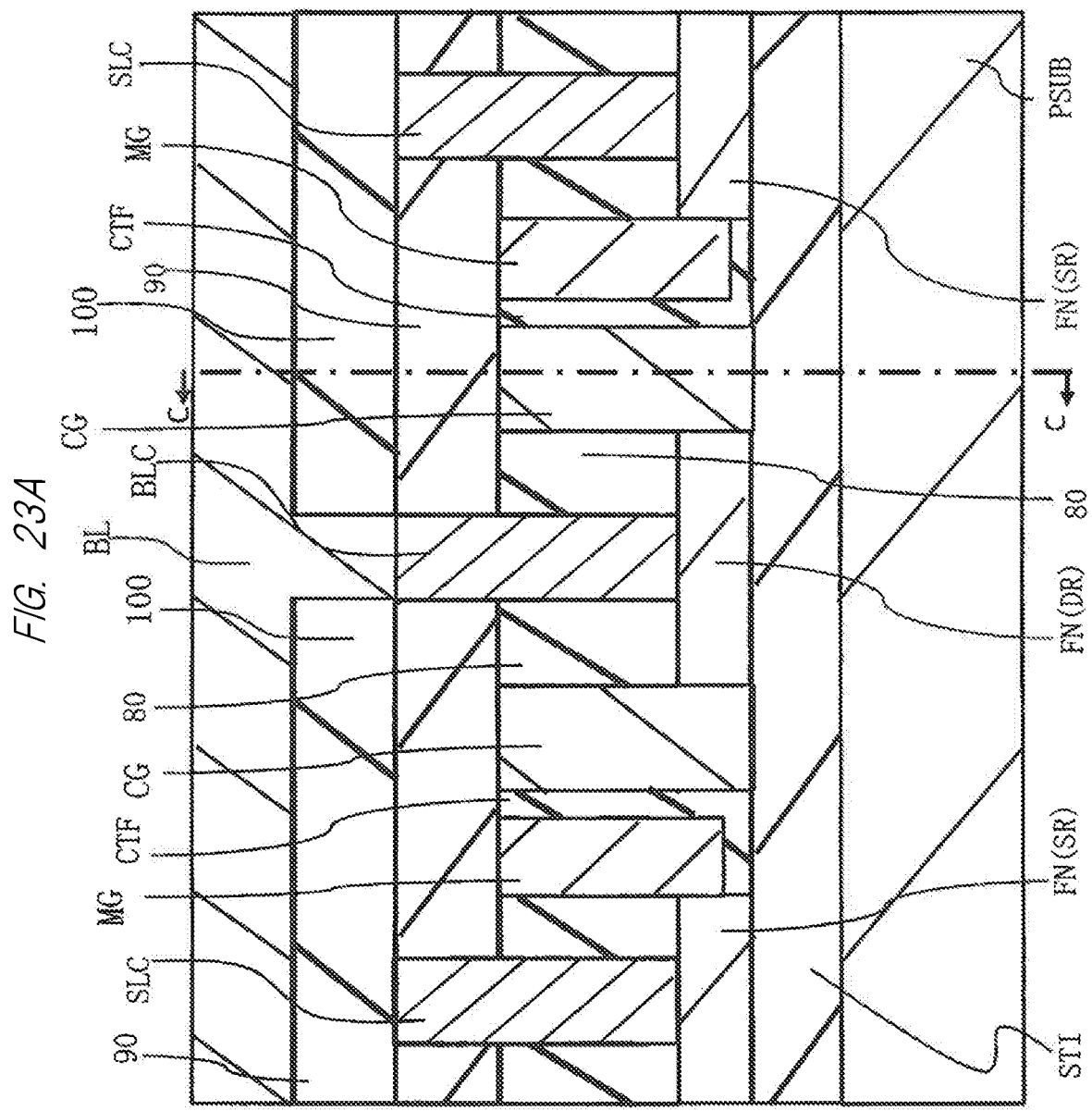
FIG. 23A is a cross-sectional view showing a principal part in the manufacturing process of the memory cell using the FinFET having the split-gate type MONOS following FIG. 22A.
Figure 23B:
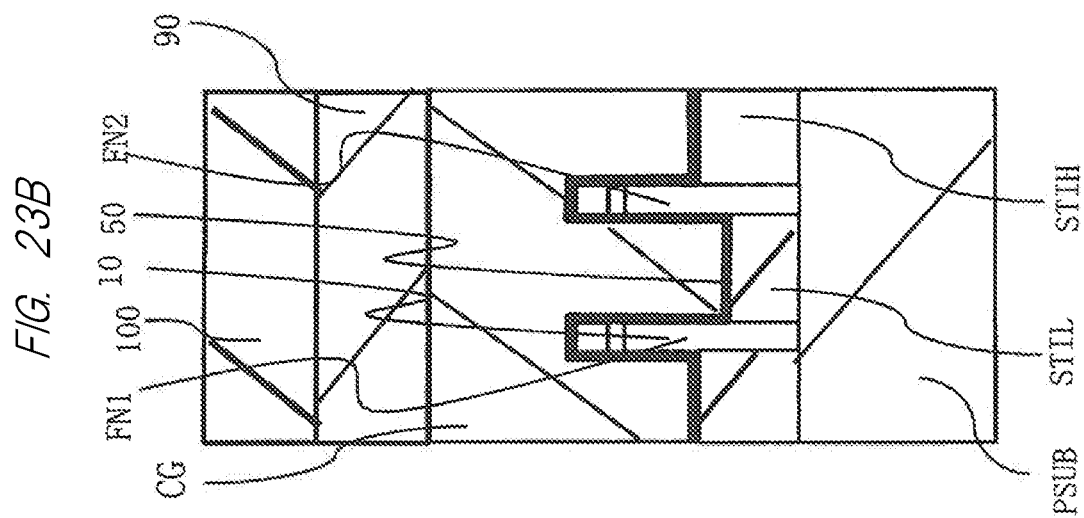
FIG. 23B is a cross-sectional view showing a principal part corresponding to the one-dot chain line C-C in FIG. 23A.

Next, a silicon oxide film is formed over the entire surface of the semiconductor substrate PSUB by, for example, the CVD method, thereby forming an interlayer insulating film 100. Thereafter, a contact hole is formed in the interlayer insulating film 100, and the bit line BL made of a metal material such as copper is formed so as to be electrically connected to the bit line contact BLC as shown in FIG. 23A and FIG. 23B. Through the series of processes described above, the semiconductor device having the split-gate type MONOS structure shown in FIG. 6 can be formed.

First Modification

In the first embodiment, the fins FN formed on the semiconductor substrate PSUB have the uniform height, but the fins FN having substantially different heights (in other words, trenches having different depths) can be formed by using the so-called double patterning process.

Figure 24:
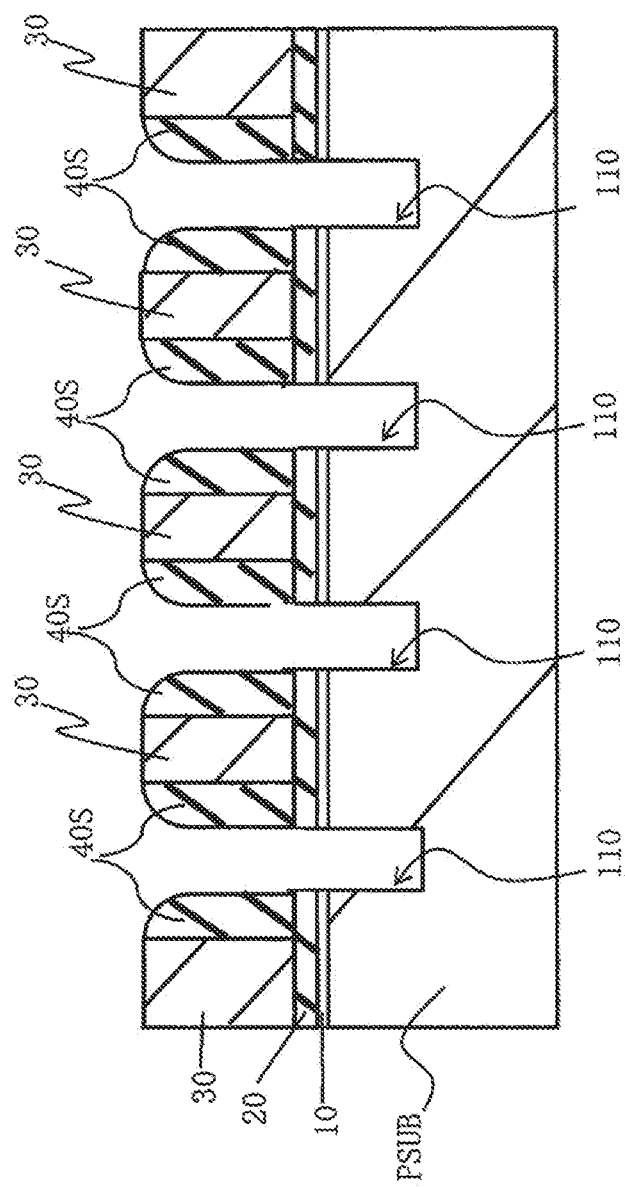
FIG. 24 is a cross-sectional view showing a principal part in a manufacturing method of a semiconductor device according to a first modification of the embodiment.

For example, after the process shown in FIG. 10, the semiconductor substrate PSUB is etched with using the amorphous carbon layer 30 and the spacers 40S as a mask, thereby forming trenches 110 with a predetermined depth as shown in FIG. 24. For example, when the film thickness of the charge trapping film CTF is 20 nm, the substrate etching of 20 nm is performed.

Figure 25:
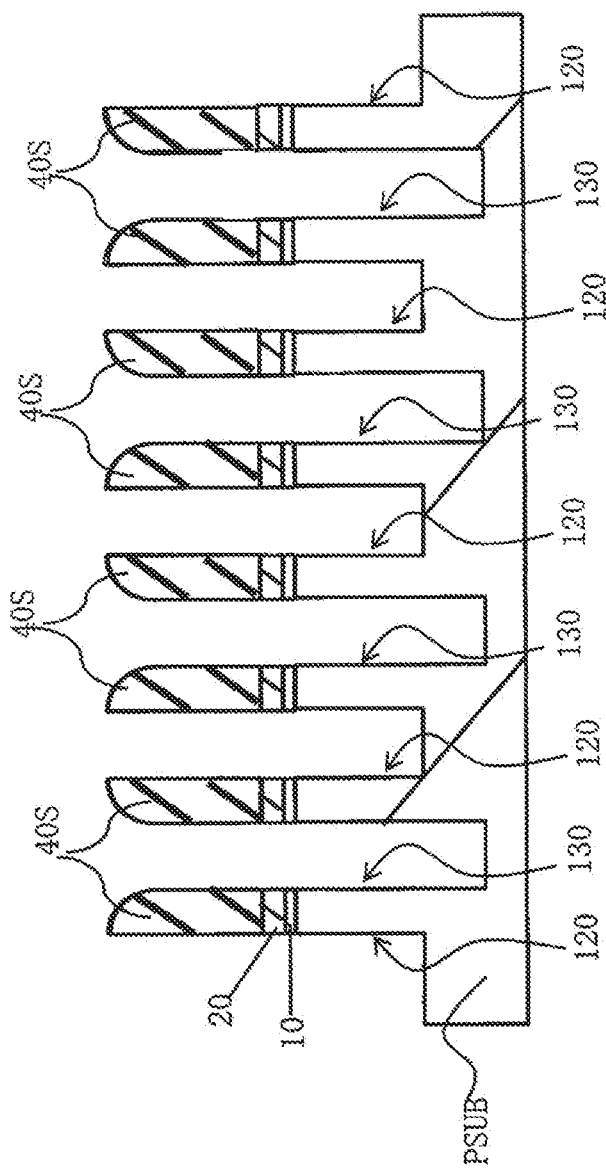
FIG. 25 is a cross-sectional view showing a principal part in the manufacturing method following FIG. 24.

Next, as shown in FIG. 25, after the amorphous carbon layer 30 is removed, the semiconductor substrate PSUB is etched with using the spacers 40S as a mask, thereby forming trenches 120 and trenches 130 having different depths alternately for each of the fins FN. Since the fin structures having substantially different heights can be formed by forming the trenches 120 and the trenches 130 having different depths, the uniform isolation thickness can be maintained, so that the reliability of the element isolation characteristics can be improved.

In the foregoing, the invention made by the inventors of the present invention has been specifically described based on the embodiment. However, the present invention is not limited to the above-described embodiment, and various modifications are possible within the range not departing from the gist thereof.

Second Modification

Figure 26:
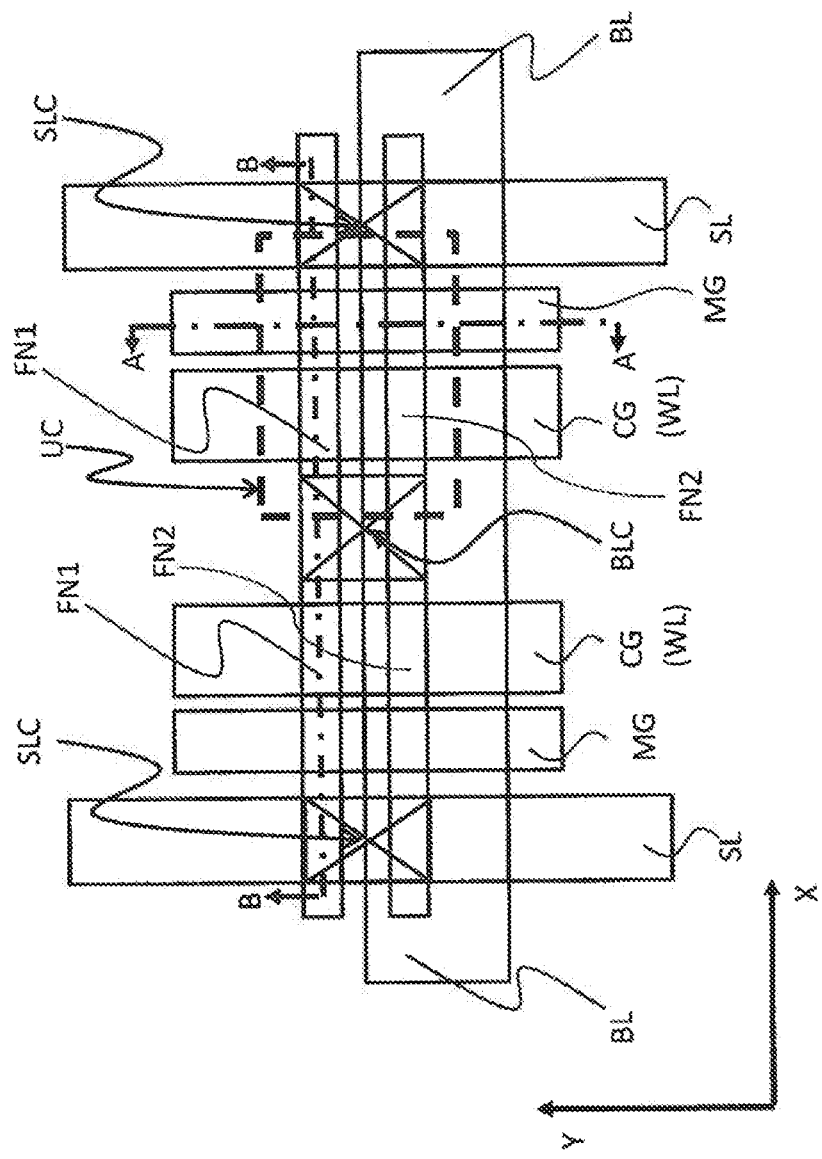
FIG. 26 is a planar layout diagram showing a structure of a semiconductor device according to a second modification of the embodiment.

For example, as shown in FIG. 26, the bit line BL can be arranged so as to be shifted to the bit line contact BLC by half a cycle. In this case, since the fins that do not overlap the bit line BL can be secured, the charge storage characteristics can be improved.

What is claimed is:

1. A semiconductor device having a split-gate type MONOS structure, the semiconductor device comprising:
   a semiconductor substrate having a main surface;
   a first fin which is a part of the semiconductor substrate, is formed so as to selectively protrude from the main surface of the semiconductor substrate, and extends in a first direction in plan view;
   a second fin which is a part of the semiconductor substrate, is formed so as to selectively protrude from the main surface of the semiconductor substrate, and is formed along the first fin at a predetermined interval with the first fin;
   an isolation region which is formed on the main surface of the semiconductor substrate and is formed to have an upper surface located at a position lower than a position of upper surfaces of the first fin and the second fin;
   a control gate which is formed so as to sandwich each of the first fin and the second fin via a gate dielectric film formed on surfaces of the first fin and the second fin and extends in a second direction intersecting the first direction in plan view;
   a memory gate which is formed so as to sandwich each of the first fin and the second fin via a charge trapping film formed on the surfaces of the first fin and the second fin and extends adjacently along the control gate in plan view;
   a first source region and a second source region which are respectively formed in the first fin and the second fin located on one side surface of a split-gate structure configured of the control gate and the memory gate; and
   a first drain region and a second drain region which are respectively formed in the first fin and the second fin located on the other side surface of the split-gate structure,
   wherein the first source region and the second source region constitute a common source electrically connected by a source line contact,
   wherein the first drain region and the second drain region constitute a common drain electrically connected by a bit line contact, and
   wherein the control gate, the memory gate, the common source, and the common drain constitute a memory cell of 1 bit.

2. The semiconductor device according to claim 1, wherein the isolation region includes a first portion arranged between the first fin and the second fin and a second portion arranged outside the first fin and the second fin in plan view, and
   wherein an upper surface of the first portion is lower than an upper surface of the second portion in a thickness direction of the semiconductor substrate.

3. The semiconductor device according to claim 2, wherein the upper surface of the second portion has almost the same height as an upper surface of the charge trapping film formed on the first portion of the isolation region.

4. The semiconductor device according to claim 3, wherein the charge trapping film is configured of a stacked film of a first silicon oxide film, a silicon nitride film formed on the first silicon oxide film, and a silicon oxide film formed on the silicon nitride film.

5. A semiconductor device comprising:
   a first memory cell which is formed in a first region of a semiconductor substrate, has a split-gate type MONOS structure, and is configured of a first FinFET; and
   a second memory cell which is formed in a second region of the semiconductor substrate different from the first region, has a split-gate type MONOS structure, and is configured of a second FinFET,
   wherein each of the first FinFET and the second FinFET is formed of a FinFET using a plurality of fins,
   wherein the first FinFET has a plurality of first source regions formed in the plurality of fins and the plurality of first source regions are commonly connected by a first source line contact,
   wherein the second FinFET has a plurality of second source regions formed in the plurality of fins and the plurality of second source regions are commonly connected by a second source line contact, and
   wherein the first FinFET and the second FinFET have a plurality of common drain regions formed in the plurality of fins and the plurality of common drain regions are commonly connected by a bit line contact.

6. The semiconductor device according to claim 5, wherein the plurality of common drain regions are arranged between memory gates of each of the first FinFET and the second FinFET.

7. The semiconductor device according to claim 5, further comprising an isolation region formed between the fins,
   wherein the isolation region has a first portion arranged between the plurality of fins and a second portion arranged outside the plurality of fins in plan view, and
   wherein an upper surface of the first portion is lower than an upper surface of the second portion in a thickness direction of the semiconductor substrate.

8. A semiconductor device comprising:
   a semiconductor substrate having a main surface; and
   a memory cell which is formed on the main surface of the semiconductor substrate, has a split-gate type MONOS structure, and is configured of a FinFET,
   wherein the FinFET is formed of a FinFET using a plurality of fins,
   wherein the FinFET has a plurality of source regions formed in the plurality of fins and the plurality of source regions are commonly connected by a source line contact,
   wherein the FinFET has a plurality of drain regions formed in the plurality of fins and the plurality of drain regions are commonly connected by a bit line contact, and
   wherein the FinFET constitutes a memory cell of 1 bit.

9. The semiconductor device according to claim 8, wherein the number of the plurality of fins is 2.

* * * * *